(12) United States Patent
Miura et al.

(10) Patent No.: US 10,622,225 B2
(45) Date of Patent: Apr. 14, 2020

(54) SUBSTRATE PROCESSING APPARATUS AND NOZZLE CLEANING METHOD

(71) Applicant: SCREEN Holdings Co., Ltd., Kyoto (JP)

(72) Inventors: Atsuyasu Miura, Kyoto (JP); Masahide Ikeda, Kyoto (JP); Hiroki Tsujikawa, Kyoto (JP); Kazuhiro Fujita, Kyoto (JP); Yuya Tsuchihashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 184 days.

(21) Appl. No.: 15/670,186

(22) Filed: Aug. 7, 2017

(65) Prior Publication Data

US 2018/0061678 A1    Mar. 1, 2018

(30) Foreign Application Priority Data

Aug. 29, 2016    (JP) ................................ 2016-166951

(51) Int. Cl.
*H01L 21/02* (2006.01)
*H01L 21/67* (2006.01)
(Continued)

(52) U.S. Cl.
CPC .......... *H01L 21/67051* (2013.01); *B05B 1/02* (2013.01); *B05B 15/55* (2018.02);
(Continued)

(58) Field of Classification Search
CPC ........... H01L 21/67051; H01L 21/6708; H01L 21/67028; H01L 21/67034;
(Continued)

(56) References Cited

U.S. PATENT DOCUMENTS 6,983,755 B2 *   1/2006   Nam ....................... B08B 3/12
                                                        134/103.2
7,891,365 B2 *   2/2011   Hirao ................ H01L 21/67051
                                                        134/104.2
(Continued)

FOREIGN PATENT DOCUMENTS

JP       H11-297652 A    10/1999
JP       2007-123559 A    5/2007
(Continued)

*Primary Examiner* — David G Cormier
*Assistant Examiner* — Thomas Bucci
(74) *Attorney, Agent, or Firm* — Ostrolenk Faber LLP

(57) ABSTRACT

The controller of a substrate processing apparatus carries out a liquid column forming step in which cleaning liquid is discharged through a lower surface nozzle when a spin chuck is not holding a substrate, to form a liquid column extending upward from the lower surface nozzle, and, in parallel with the liquid column forming step, a first dropping portion cleaning step in which an upper surface nozzle is reciprocated horizontally between a first position where a dropping portion of the upper surface nozzle does not contact the liquid column and a second position where the dropping portion of the upper surface nozzle does not contact the liquid column, so as to cause the upper surface nozzle to pass through a first middle position where the upper discharge port of the upper surface nozzle overlaps with the liquid column in a plan view.

8 Claims, 14 Drawing Sheets

(51) Int. Cl.
*B05B 15/555* (2018.01)
*B05B 15/55* (2018.01)
*B05B 1/02* (2006.01)

(52) U.S. Cl.
CPC ........ *B05B 15/555* (2018.02); *H01L 21/6715* (2013.01); *H01L 21/67028* (2013.01); *H01L 21/67034* (2013.01)

(58) Field of Classification Search
CPC ........... H01L 21/02052; H01L 21/6715; B05B 15/55; B05B 1/02; B05B 15/555
USPC ...... 134/151, 94.1, 137, 149, 157, 198, 153, 134/26, 902, 95.1, 103.2, 144, 95.3, 148
See application file for complete search history.

(56) References Cited

U.S. PATENT DOCUMENTS

| | | | | |
|---|---|---|---|---|
| 9,378,988 | B2* | 6/2016 | Osada | H01L 21/67028 |
| 2004/0173153 | A1* | 9/2004 | Muramatsu | H01L 21/67051 |
| | | | | 118/715 |
| 2005/0056306 | A1* | 3/2005 | Jeong | B08B 3/02 |
| | | | | 134/94.1 |
| 2005/0252526 | A1* | 11/2005 | Ogawa | B08B 3/04 |
| | | | | 134/2 |
| 2007/0175501 | A1* | 8/2007 | Amai | B08B 1/04 |
| | | | | 134/149 |
| 2007/0256633 | A1* | 11/2007 | Lin | H01L 21/6708 |
| | | | | 118/52 |
| 2009/0114248 | A1* | 5/2009 | Kim | H01L 21/67034 |
| | | | | 134/7 |
| 2009/0114253 | A1* | 5/2009 | Matsumoto | C11D 11/0047 |
| | | | | 134/30 |
| 2010/0051059 | A1* | 3/2010 | Kometani | B08B 9/00 |
| | | | | 134/21 |
| 2010/0247761 | A1* | 9/2010 | Hashimoto | H01L 21/67051 |
| | | | | 427/240 |
| 2013/0020284 | A1* | 1/2013 | Osada | H01L 21/67028 |
| | | | | 216/57 |
| 2016/0005630 | A1* | 1/2016 | Fujiwara | H01L 21/67051 |
| | | | | 438/5 |
| 2016/0279678 | A1 | 9/2016 | Yoshitomi et al. | |
| 2017/0056917 | A1* | 3/2017 | Imamura | B05D 1/005 |

FOREIGN PATENT DOCUMENTS

| | | |
|---|---|---|
| KR | 10-2012-0015662 A | 2/2012 |
| KR | 10-2015-0140612 A | 12/2015 |
| KR | 10-2016-0031470 A | 3/2016 |
| TW | I293578 B | 2/2008 |
| TW | 201643954 A | 12/2016 |
| TW | I567853 B | 1/2017 |
| TW | 201715573 A | 5/2017 |

* cited by examiner

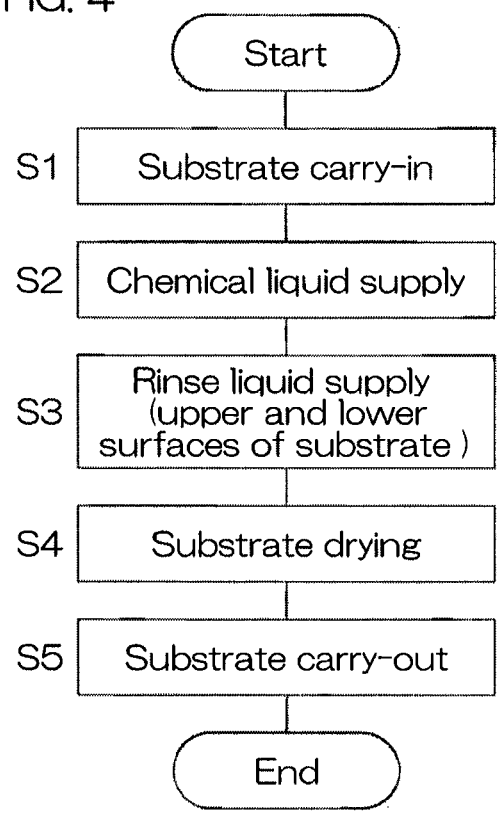

FIG. 5A Chemical liquid supply
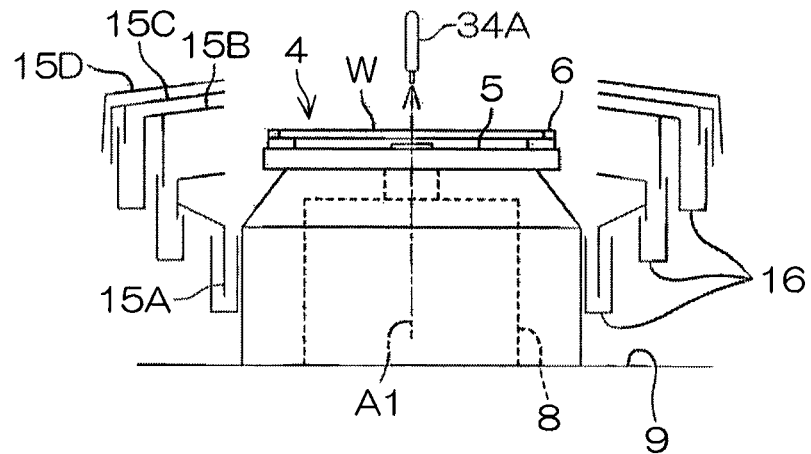
FIG. 5B Rinse liquid supply
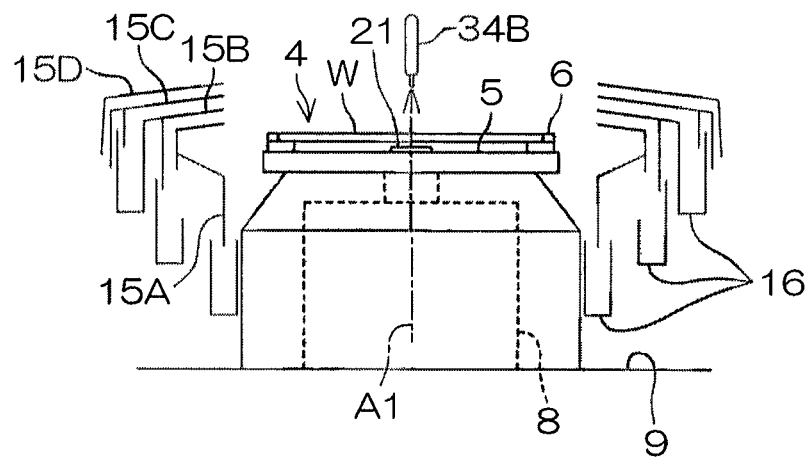
FIG. 5C Drying
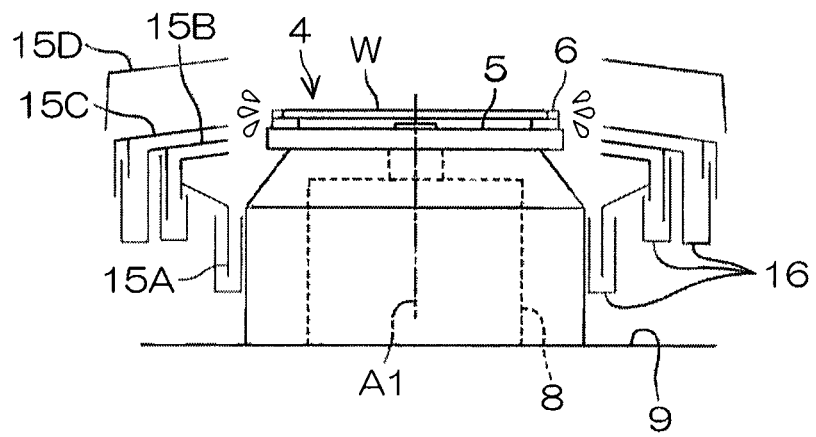

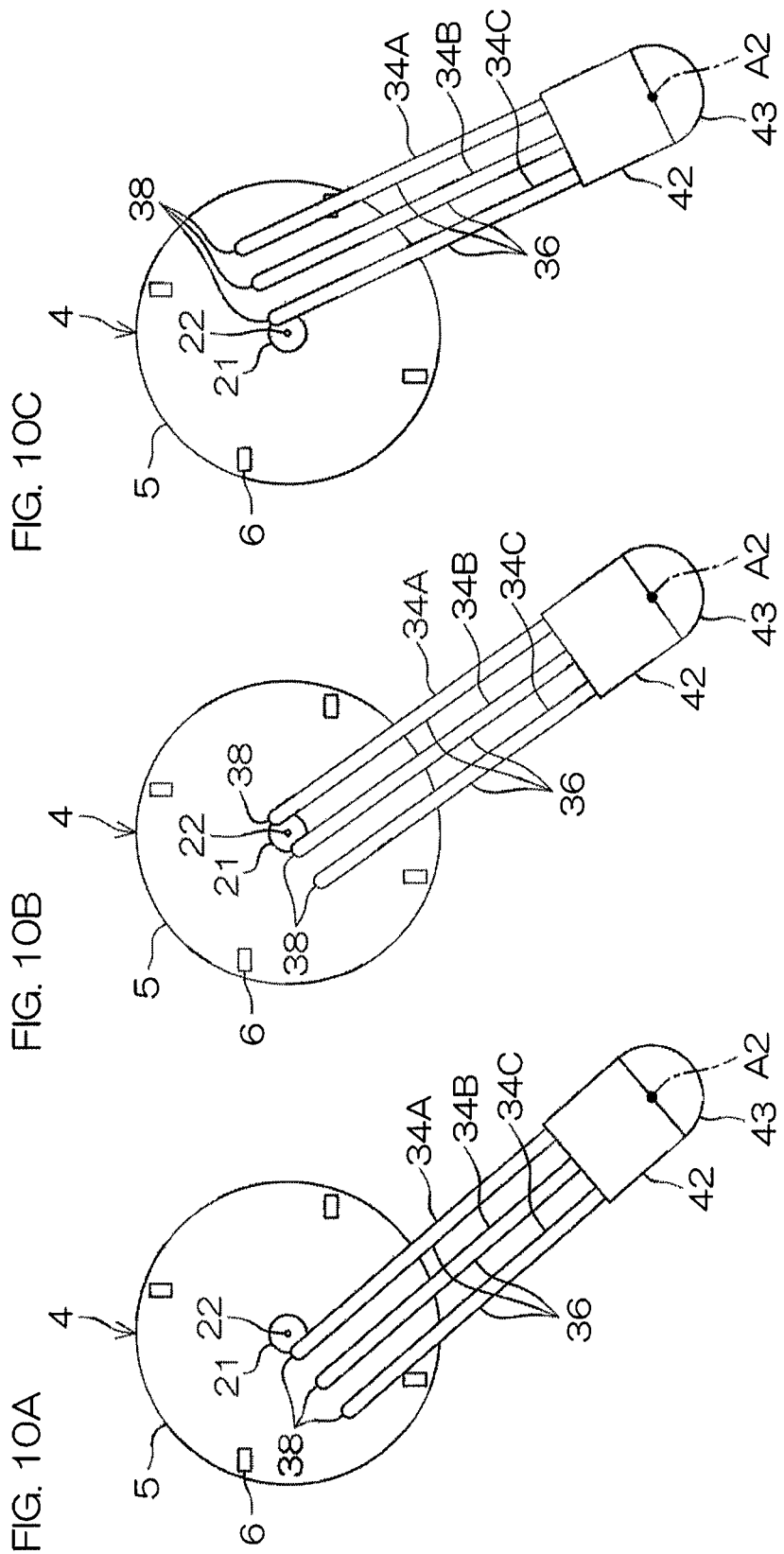

SUBSTRATE PROCESSING APPARATUS AND NOZZLE CLEANING METHOD

BACKGROUND OF THE INVENTION

1. Field of the Invention

The present invention relates to a substrate processing apparatus that processes a substrate and a nozzle cleaning method that cleans a nozzle included in the substrate processing apparatus.

Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal display devices, substrate processing apparatuses are used for processing substrates such as semiconductor wafers or glass panels for liquid crystal display devices. Japanese Patent Application Publication No. 2007-123559 discloses a single substrate processing-type substrate processing apparatus that processes substrates one by one. In this substrate processing apparatus, for cleaning of the interior of the chemical liquid processing nozzle, pure water serving as nozzle cleaning liquid is discharged from a lower nozzle provided in a spin chuck toward the tip portion of the chemical liquid processing nozzle in a state where the discharge port of the chemical liquid processing nozzle located above the spin chuck is opposing the discharge port of the lower nozzle. It is stated that this results in cleaning of the interior and the like of the chemical liquid processing nozzle.

However, the substrate processing apparatus of Japanese Patent Application Publication No. 2007-123559 cleans only the interior of the chemical liquid processing nozzle and not the outer peripheral surface of the chemical liquid processing nozzle. As proof, FIG. 4 of Japanese Patent Application Publication No. 2007-123559 shows pure water that has been discharged upward from the lower nozzle, being supplied only to the discharge port that opens to the lower surface of the chemical liquid processing nozzle. Paragraph [0093] of Japanese Patent Application Publication No. 2007-123559 discloses swinging of the chemical liquid processing nozzle with respect to the lower nozzle in the horizontal direction, but it is not disclosed whether or not the pure water discharged from the lower nozzle is supplied to the outer peripheral surface of the chemical liquid processing nozzle when the chemical liquid processing nozzle is being swung.

SUMMARY OF THE INVENTION

A preferred embodiment of the invention provides a substrate processing apparatus including a substrate holding unit that rotates a substrate disposed at a substrate holding position while holding the substrate horizontally, a lower surface nozzle that discharges a liquid upward toward the substrate holding position and serves as a first cleaning nozzle, a first cleaning liquid supply unit that causes the lower surface nozzle to discharge cleaning liquid by supplying the cleaning liquid to the lower surface nozzle, an upper surface nozzle including a horizontal portion that extends horizontally, a corner portion that is bent downward from a tip of the horizontal portion, a dropping portion that extends downward from the corner portion, and an upper discharge port that opens at a lower surface of the dropping portion, which discharges liquid downward from the upper discharge port toward the substrate holding position, a nozzle moving unit that moves the upper surface nozzle at least in a horizontal direction, and a controller that controls the first cleaning liquid supply unit and the nozzle moving unit.

The controller is programed to carry out a liquid column forming step of forming a liquid column that extends upward from the lower surface nozzle by causing the lower surface nozzle to discharge the cleaning liquid when the substrate holding unit is not holding the substrate, and nozzle to pass through a first middle position where the upper discharge port of the upper surface nozzle overlaps with the liquid column in a plan view by horizontally reciprocating the upper surface nozzle between a first position where the dropping portion of the upper surface nozzle does not contact the liquid column and a second position where the dropping portion of the upper surface nozzle does not contact the liquid column in parallel with the liquid column forming step.

According to this arrangement, when the substrate holding unit is not holding the substrate, the upper surface nozzle is reciprocated horizontally between the first position and the second position while the cleaning liquid is being discharged upward through the lower surface nozzle. At the first middle position between the first position and the second position, the cleaning liquid that has been discharged from the lower surface nozzle enters into the upper surface nozzle through the upper discharge port of the upper surface nozzle. The chemical liquid or its crystals inside the upper surface nozzle are discharged downward from the upper discharge port, together with the cleaning liquid. The interior of the upper surface nozzle is thus cleaned.

When the upper surface nozzle is moving from the first position to the first middle position, one side portion of the dropping portion of the upper surface nozzle contacts with a column of the cleaning liquid extending upward from the lower surface nozzle, and the cleaning liquid is supplied to the one side portion of the dropping portion. Similarly, when the upper surface nozzle is moving from the second position to the first middle position, the other side portion of the dropping portion of the upper surface nozzle contacts with the column of the cleaning liquid extending upward from the lower surface nozzle, and the cleaning liquid is supplied to the other side portion of the dropping portion. Furthermore, the cleaning liquid supplied to the dropping portion flows downward along the dropping portion while flowing in the opposite direction from the movement direction of the upper surface nozzle along the dropping portion. This causes the cleaning liquid to also be supplied to the portion of the dropping portion that did not contact the liquid column.

Thus, since the cleaning liquid is reliably supplied not only to the interior of the upper surface nozzle but also to the outer peripheral surface of the dropping portion, both the interior and the outer peripheral surface of the upper surface nozzle can be reliably cleaned. This can reduce the amount of residue of chemical liquid or its crystals adhering to the upper surface nozzle, and can minimize or prevent contamination of the substrate. In addition, since the lower surface nozzle that discharges liquid toward the lower surface of the substrate is used as a first cleaning nozzle that cleans the upper surface nozzle, it is possible to avoid increasing the number of parts.

In the preferred embodiment, at least one of the following features may be added to the substrate processing apparatus.

The liquid column forming step is a step of forming the liquid column such that the upper end of the liquid column is positioned higher than a lower edge of the horizontal portion of the upper surface nozzle.

According to this arrangement, a high liquid column is formed, such that the upper end of the liquid column is positioned higher than the lower edge of the horizontal portion of the upper surface nozzle, while the other members are not in contact with the liquid column. If the liquid column is high, this will increase the area at the portion of the dropping portion where the cleaning liquid is directly supplied, when the dropping portion has contacted the liquid column. At the same time, the area of the portion of the dropping portion where the cleaning liquid is indirectly supplied, i.e. the portion where the cleaning liquid flowing along the dropping portion passes, also increases. This allows a wider region of the dropping portion to be cleaned.

The corner portion of the upper surface nozzle is a portion extending from the tip of the horizontal portion to the upper end of the dropping portion, the inside portion of the corner portion being hidden when the upper surface nozzle is viewed from above. A portion of the inside portion of the corner portion is positioned lower than the lower edge of the horizontal portion, and positioned lower than the upper end of the liquid column. The cleaning liquid that has been discharged from the lower surface nozzle is directly or indirectly supplied to at least a portion of the corner portion while the upper surface nozzle is reciprocating. This allows the cleaning liquid to be supplied even to the inside portion of the corner portion where it is difficult to supply the cleaning liquid from above, and allows the chemical liquid or its crystals to be removed from that portion.

The substrate processing apparatus further includes a second upper surface nozzle including a horizontal portion that extends horizontally, a corner portion that is bent downward from a tip of the horizontal portion, a dropping portion that extends downward from the corner portion, and an upper discharge port that opens at a lower surface of the dropping portion. The second upper surface nozzle discharges liquid downward from the upper discharge port of the second upper surface nozzle toward the substrate holding position. The nozzle moving unit moves the second upper surface nozzle at least in the horizontal direction together with the upper surface nozzle. The controller is programed to carry out a second dropping portion cleaning step of causing the second upper surface nozzle to pass through a second middle position where the upper discharge port of the second upper surface nozzle overlaps with the liquid column in a plan view by horizontally reciprocating the second upper surface nozzle between the second position where the dropping portion of the second upper surface nozzle does not contact the liquid column and a third position where the dropping portion of the second upper surface nozzle does not contact the liquid column in parallel with the liquid column forming step.

According to this arrangement, when the lower surface nozzle discharges cleaning liquid upward, the nozzle moving unit moves the second upper surface nozzle together with the upper surface nozzle. During this time, the second upper surface nozzle reciprocates between the second position and the third position. As a result, the dropping portion of the second upper surface nozzle is cleaned in addition to the dropping portion of the upper surface nozzle. Consequently, both upper surface nozzles can be cleaned without using a separate nozzle moving unit and lower surface nozzle.

The substrate processing apparatus further includes a second processing liquid tube that supplies liquid of a different type from the liquid supplied to the upper surface nozzle, to the second upper surface nozzle, and the second dropping portion cleaning step is a step of horizontally reciprocating the second upper surface nozzle between the second position and the third position at fewer times than a number of reciprocations of the upper surface nozzle in the first dropping portion cleaning step.

According to this arrangement, the number of reciprocations is varied depending on the type of liquid discharged toward the substrate. Since the number of reciprocations between the first position and the second position is greater than the number of reciprocations between the second position and the third position, the dropping portion of the upper surface nozzle can be more thoroughly cleaned. In addition, when the dropping portion of the second upper surface nozzle is more likely to be fouled than the dropping portion of the upper surface nozzle, the dropping portion of the second upper surface nozzle can be thoroughly cleaned even with a low number of reciprocations between the second position and the third position. This will allow the cleaning time to be shortened while effectively cleaning both upper surface nozzles.

The substrate processing apparatus further includes a second cleaning nozzle that discharges the cleaning liquid toward the horizontal portion of the upper surface nozzle located at a standby position where the upper surface nozzle is disposed around the substrate holding unit in a plan view, and the controller is further programmed to carry out a horizontal portion cleaning step of causing the second cleaning nozzle to discharge the cleaning liquid toward the horizontal portion of the upper surface nozzle located at the standby position. The cleaning liquid discharged from the second cleaning nozzle may be the same type of liquid as the cleaning liquid discharged from the lower surface nozzle serving as the first cleaning nozzle, or it may be a different type of liquid. The standby position may be a high standby position or a low standby position, as described below, or it may contain both the high standby position and the low standby position.

According to this arrangement, the cleaning liquid is discharged from the second cleaning nozzle toward the horizontal portion of the upper surface nozzle that is located at the standby position. As a result, the cleaning liquid is supplied to the horizontal portion and the horizontal portion is cleaned. It is therefore possible to further reduce the amount of residue of the chemical liquid or crystals adhering to the upper surface nozzle. Moreover, since the horizontal portion is cleaned while the upper surface nozzle is located at a standby position, the cleaning liquid containing the chemical liquid or its crystals is less likely to fall down onto the substrate holding unit. It is thus possible to clean the horizontal portion of the upper surface nozzle while preventing fouling of the substrate holding unit.

The second cleaning nozzle includes a second cleaning liquid discharge port that discharges the cleaning liquid in an obliquely inclined direction with respect to a horizontal plane, toward the horizontal portion of the upper surface nozzle located at the standby position, and the horizontal portion cleaning step is a step causing the upper surface nozzle to move in the horizontal direction or a vertical direction while causing the second cleaning liquid discharge port of the second cleaning nozzle to discharge the cleaning liquid toward the horizontal portion of the upper surface nozzle located at the standby position.

According to this arrangement, the upper surface nozzle is moved in the horizontal direction or the vertical direction while discharging the cleaning liquid obliquely through the second cleaning nozzle. At least a portion of the cleaning liquid that has been discharged from the second cleaning nozzle directly impacts the horizontal portion. If the upper surface nozzle is moved in either the horizontal direction or the vertical direction, the position where the cleaning liquid directly impacts the upper surface nozzle will change. It is thus possible to widen the area of the portion where the cleaning liquid directly impacts. This allows the horizontal portion to be effectively cleaned.

The substrate processing apparatus further includes a third cleaning nozzle that discharges the cleaning liquid downward toward the dropping portion of the upper surface nozzle located at the first middle position, and the first dropping portion cleaning step is a step of causing the lower surface nozzle and the third cleaning nozzle to discharge the cleaning liquid while horizontally reciprocating the upper surface nozzle between the first position and the second position. The cleaning liquid discharged from the third cleaning nozzle may be the same type of liquid as the cleaning liquid discharged from the lower surface nozzle serving as the first cleaning nozzle, or it may be a different type of liquid.

According to this arrangement, a column of the cleaning liquid is formed extending upward from the lower surface nozzle serving as the first cleaning nozzle, and a column of the cleaning liquid is formed extending downward from the third cleaning nozzle. The dropping portion of the upper surface nozzle passes through these liquid columns, while the upper surface nozzle is reciprocating between the first position and the second position. This can further reduce the amount of residue of chemical liquid or its crystals adhering to the outer peripheral surface of the dropping portion. In addition, since the lower surface nozzle and the third cleaning nozzle discharge the cleaning liquid in different directions, the cleaning liquid can be supplied to a wider region of the upper surface nozzle. This allows the cleanliness of the upper surface nozzle to be increased.

The substrate processing apparatus further includes a fan unit that is disposed higher than the substrate holding unit and the upper surface nozzle and delivers gas downward, and a baffle member that is disposed at a position that is higher than the substrate holding unit and the upper surface nozzle and lower than the fan unit, and is provided with a plurality of through-holes that guide the gas delivered by the fan unit downward, and the third cleaning nozzle includes an upper portion located above the baffle member, a tip portion that extends from the upper portion to a position under the baffle member, through an insertion hole provided in the baffle member, and a third cleaning liquid discharge port provided at the tip portion and located under the baffle member, and discharges the cleaning liquid downward from the third cleaning liquid discharge port toward the dropping portion of the upper surface nozzle located at the first middle position.

According to this arrangement, gas that has been delivered downward by the fan unit diffuses in the space between the fan unit and the baffle member and flows downward from the plurality of through-holes of the baffle member. This forms a downward flow of gas, reducing upward diffusion of mist and droplets. Therefore, fouling of the upper surface nozzle by adhesion of mist and droplets can be reduced. In addition, since the entire third cleaning nozzle is not disposed below the baffle member but rather only a portion of the third cleaning nozzle is disposed below the baffle member, the space below the baffle member can be effectively utilized.

The lower surface nozzle includes a lower discharge port that discharges liquid upward toward the upper discharge port of the upper surface nozzle located at the first middle position, and at least one secondary discharge port that discharges liquid upward toward the horizontal portion of the upper surface nozzle located at the first middle position, and the first dropping portion cleaning step is a step of causing the lower discharge port and the at least one secondary discharge port to discharge the cleaning liquid while horizontally reciprocating the upper surface nozzle between the first position and the second position.

There are formed, according to this arrangement, a column of cleaning liquid extending upward from the lower discharge port of the lower surface nozzle and a column of cleaning liquid extending upward from the secondary discharge port of the lower surface nozzle. While the upper surface nozzle is reciprocating between the first position and the second position, the dropping portion of the upper surface nozzle passes horizontally through the liquid column extending upward from the lower discharge port of the lower surface nozzle. Also, while the upper surface nozzle is reciprocating between the first position and the second position, the horizontal portion of the upper surface nozzle passes horizontally through the liquid column extending upward from the secondary discharge port of the lower surface nozzle. This allows portions other than the dropping portion of the upper surface nozzle to be cleaned.

In the substrate processing apparatus, the lower surface nozzle further includes a main flow passage that supplies the cleaning liquid to each of a plurality of discharge ports including the lower discharge port and the at least one secondary discharge port.

According to this arrangement, when the cleaning liquid is supplied to the main flow passage of the lower surface nozzle, the cleaning liquid flowing through the main flow passage is supplied to the lower discharge port and the secondary discharge port of the lower surface nozzle. As a result, the lower discharge port and secondary discharge port discharge the cleaning liquid upward. Thus, by simply supplying the cleaning liquid to the main flow passage, it is possible to discharge the cleaning liquid through all of the discharge ports including the lower discharge port and the secondary discharge port.

Another preferred embodiment of the invention provides a nozzle cleaning method which cleans an upper surface nozzle that discharges liquid downward from an upper discharge port toward an upper surface of a substrate held by a substrate holding unit that rotates the substrate disposed at a substrate holding position while holding the substrate horizontally, and including a horizontal portion extending horizontally, a corner portion bent downward from a tip of the horizontal portion, a dropping portion extending downward from the corner portion, and the upper discharge port opening at a lower surface of the dropping portion.

The nozzle cleaning method includes a liquid column forming step of forming a liquid column that extends upward from a lower surface nozzle, that discharges liquid upward toward the substrate holding position, by causing the lower surface nozzle to discharge cleaning liquid when the substrate holding unit is not holding the substrate, and a first dropping portion cleaning step of causing the upper surface nozzle to pass through a first middle position where the upper discharge port of the upper surface nozzle overlaps with the liquid column in a plan view by horizontally reciprocating the upper surface nozzle between a first position where the dropping portion of the upper surface nozzle does not contact the liquid column and a second position where the dropping portion of the upper surface nozzle does not contact the liquid column in parallel with the liquid column forming step. According to this method, the same effect can be exhibited as the one described above.

In the preferred embodiment, at least one of the following features may be added to the nozzle cleaning method.

The liquid column forming step is a step of forming the liquid column such that an upper end of the liquid column is positioned higher than a lower edge of the horizontal portion of the upper surface nozzle. According to this method, the same effect can be exhibited as the one described above.

The nozzle cleaning method further includes a second dropping portion cleaning step of causing a second upper surface nozzle to pass through a second middle position where an upper discharge port of the second upper surface nozzle overlaps with the liquid column in a plan view by causing a nozzle moving unit, that moves the upper surface nozzle, to reciprocate horizontally the second upper surface nozzle between the second position where a dropping portion of the second upper surface nozzle does not contact the liquid column and a third position where the dropping portion of the second upper surface nozzle does not contact the liquid column in parallel with the liquid column forming step. According to this method, the same effect can be exhibited as the one described above.

The second dropping portion cleaning step is a step of horizontally reciprocating the second upper surface nozzle between the second position and the third position at fewer times than a number of reciprocations of the upper surface nozzle in the first dropping portion cleaning step. According to this method, the same effect can be exhibited as the one described above.

The nozzle cleaning method further includes a horizontal portion cleaning step of causing a second cleaning nozzle to discharge the cleaning liquid toward the horizontal portion of the upper surface nozzle located at a standby position where the upper surface nozzle is disposed around the substrate holding unit in a plan view. According to this method, the same effect can be exhibited as the one described above.

The second cleaning nozzle includes a second cleaning liquid discharge port that discharges the cleaning liquid in an obliquely inclined direction with respect to a horizontal plane, toward the horizontal portion of the upper surface nozzle located at the standby position, and the horizontal portion cleaning step is a step of causing the upper surface nozzle to move in a horizontal direction or a vertical direction while causing the second cleaning liquid discharge port of the second cleaning nozzle to discharge the cleaning liquid toward the horizontal portion of the upper surface nozzle located at the standby position. According to this method, the same effect can be exhibited as the one described above.

The first dropping portion cleaning step is a step of causing the lower surface nozzle and a third cleaning nozzle, that discharges the cleaning liquid downward toward the dropping portion of the upper surface nozzle located at the first middle position, to discharge the cleaning liquid while horizontally reciprocating the upper surface nozzle between the first position and the second position. According to this method, the same effect can be exhibited as the one described above.

The lower surface nozzle includes a lower discharge port that discharges liquid upward toward the upper discharge port of the upper surface nozzle located at the first middle position, and at least one secondary discharge port that discharges liquid upward toward the horizontal portion of the upper surface nozzle located at the first middle position, and the first dropping portion cleaning step is a step of causing the lower discharge port and the at least one secondary discharge port to discharge the cleaning liquid while horizontally reciprocating the upper surface nozzle between the first position and the second position. According to this method, the same effect can be exhibited as the one described above.

The foregoing and other objects, features and advantages of the present invention will become more apparent from the description of preferred embodiments provided below with reference to the accompanying drawings.

BRIEF DESCRIPTION OF THE DRAWINGS

FIG. 4 is a flow chart for describing an example of processing of a substrate carried out by a substrate processing apparatus.

FIG. 5A shows the state of a processing unit while the chemical liquid supply step is being carried out.

FIG. 5B shows the state of a processing unit while the rinse liquid supply step is being carried out.

FIG. 5C shows the state of a processing unit while the drying step is being carried out.

FIG. 6 shows the plurality of upper surface nozzles disposed at the high standby position.

FIG. 7 shows the plurality of upper surface nozzles located at the high standby positions by a solid line, and the plurality of upper surface nozzles located at the low standby positions by an alternate long and two short dashes line.

FIG. 10A shows the state of the plurality of upper surface nozzles disposed at first positions.

FIG. 10B shows the state of the plurality of upper surface nozzles disposed at second positions.

FIG. 10C shows the state of the plurality of upper surface nozzles disposed at third positions.

FIG. 13 indicates the plurality of upper surface nozzles located at the high standby positions by alternate long and two short dashes lines, and the plurality of upper surface nozzles located at the low standby positions by solid lines.

FIG. 15 indicates the plurality of upper surface nozzles located at the high standby positions, corresponding to first return positions, by solid lines, and the plurality of upper surface nozzles located at second return positions by alternate long and two short dashes lines.

DETAILED DESCRIPTION OF PREFERRED EMBODIMENTS

Figure 1:
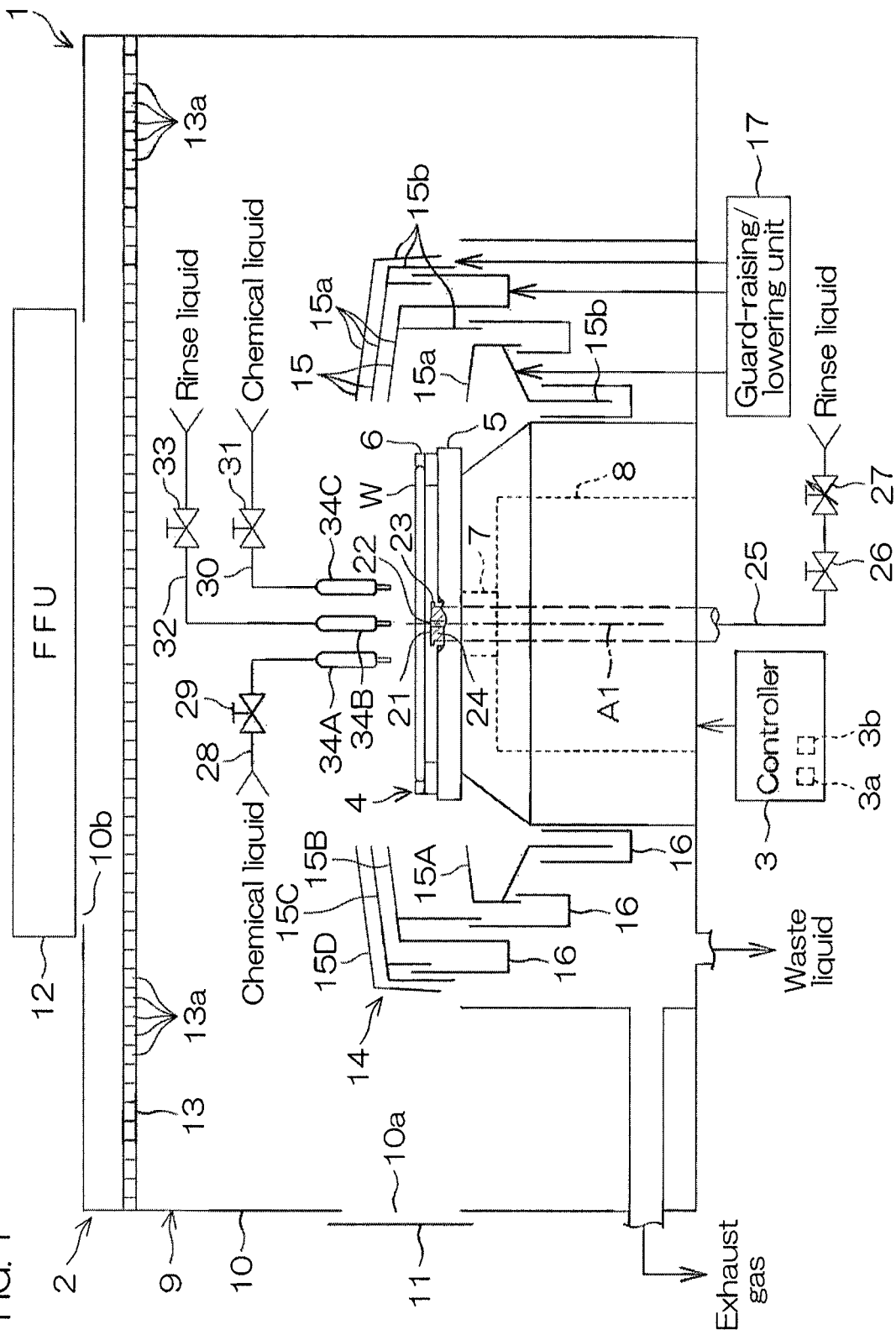
FIG. 1 is a schematic horizontal view of the interior of a processing unit provided in a substrate processing apparatus according to a first preferred embodiment of the invention.
Figure 2:
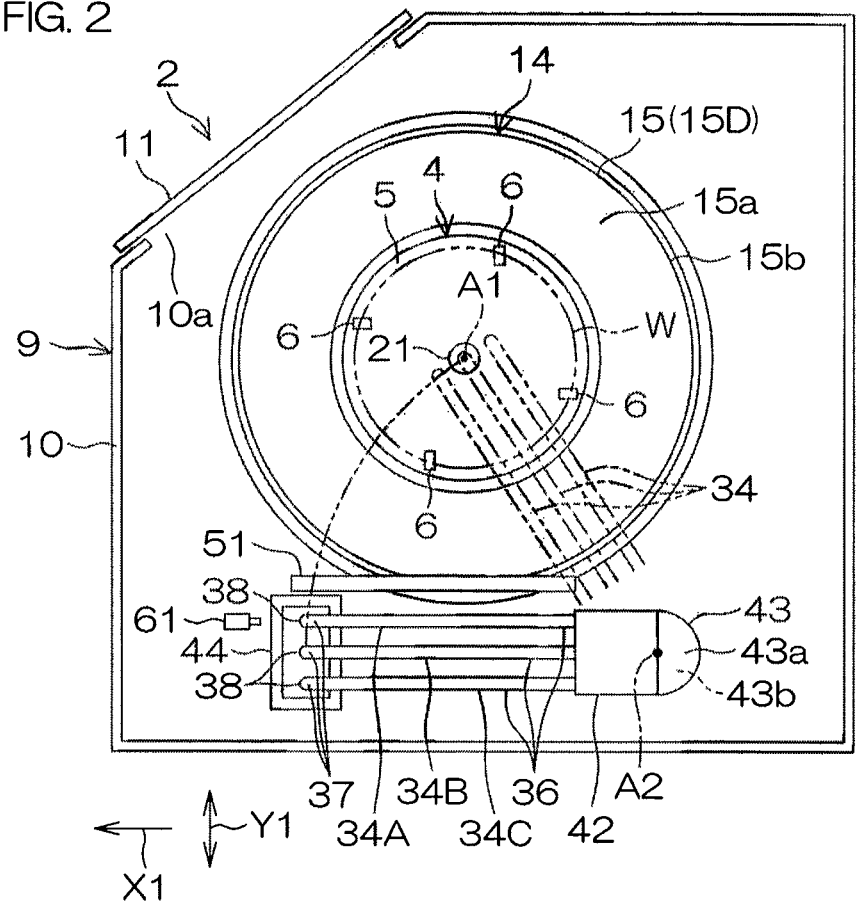
FIG. 2 is a schematic plan view showing the interior of the processing unit.
Figure 3:
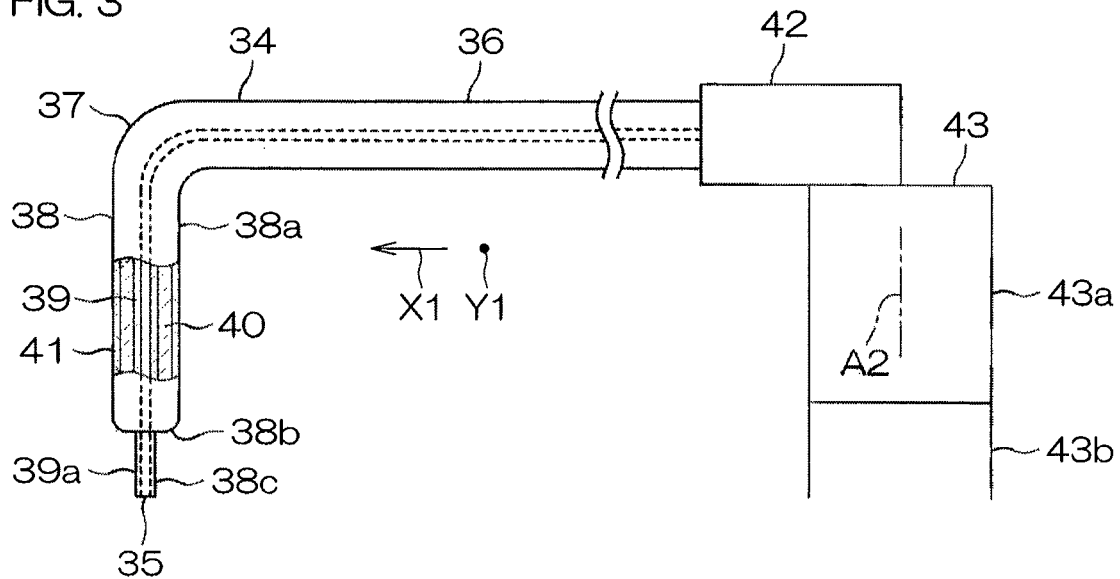
FIG. 3 is a schematic view of a plurality of upper surface nozzles as seen from the side.

FIG. 1 is a schematic horizontal view of the interior of a processing unit 2 provided in a substrate processing apparatus 1 according to the first preferred embodiment of the invention. FIG. 2 is a schematic plan view showing the interior of the processing unit 2. FIG. 3 is a schematic view of a plurality of upper surface nozzles 34 as seen from the side.

The substrate processing apparatus 1 is a single substrate processing-type apparatus that conducts processing of a disk-shaped substrate W such as a semiconductor wafer, one at a time. The substrate processing apparatus 1 includes a processing unit 2 that processes a substrate W with a processing fluid such as a processing liquid or processing gas, a transfer robot (not shown) that transports the substrate W to the processing unit 2, and a controller 3 that controls the substrate processing apparatus 1. The controller 3 is a computer including a memory 3b that stores data such as a program, and a processor 3a that controls the substrate processing apparatus 1 according to the data stored in the memory 3b.

The processing unit 2 includes a box-shaped chamber 9 with an interior space, a spin chuck 4 that holds a single substrate W horizontally in the chamber 9 while rotating it around a vertical rotational axis A1 running through the center portion of the substrate W, a plurality of nozzles that discharge a fluid toward the substrate W being held by the spin chuck 4, and a tubular processing cup 14 that receives the processing liquid that has been discharged out from the spin chuck 4.

The spin chuck 4 is an example of a substrate holding unit. The spin chuck 4 includes a disk-shaped spin base 5 that is held horizontally, a plurality of chuck pins 6 that horizontally hold the substrate W at a substrate holding position that is a position separated upward from the spin base 5 (the position where the substrate W is disposed in FIG. 1 and FIG. 2), and a chuck opening and closing mechanism (not shown) that opens and closes the plurality of chuck pins 6. The spin chuck 4 further includes a spin shaft 7 extending downward from the center portion of the spin base 5 along the rotational axis A1, and a spin motor 8 that rotates the substrate W, held by the plurality of chuck pins 6, around the rotational axis A1 by rotating the spin shaft 7.

The chamber 9 includes a box-shaped partition 10 provided with a carry-in/carry-out port 10a through which the substrate W passes, and a shutter 11 that opens and closes the carry-in/carry-out port 10a. The chamber 9 further includes an FFU (Fan Filter Unit) 12 that delivers clean air (air that has been filtered with a filter) from above the partition 10 downward into the partition 10, and a baffle plate 13 that rectifies the clean air delivered into the partition 10 by the FFU 12.

The FFU 12 is disposed above a blast port 10b that opens at the ceiling surface of the partition 10. The baffle plate 13 is disposed under the blast port 10b. The FFU 12 delivers clean air downward into the partition 10 through the blast port 10b. The baffle plate 13 is a porous plate having a plurality of through-holes 13a running through the thickness direction, formed over the entire region. The plurality of through-holes 13a open at the lower surface of the baffle plate 13 corresponding to the ceiling surface of the chamber 9. The baffle plate 13 is disposed in the partition 10 in a horizontal orientation.

The baffle plate 13 partitions the interior of the partition 10 into an upper space above the baffle plate 13 and a lower space under the baffle plate 13. The upper space between the ceiling surface of the partition 10 and the upper surface of the baffle plate 13 is a diffusion space in which the clean air diffuses. The lower space between the lower surface of the baffle plate 13 and the floor surface of the partition 10 is a processing space where the substrate W is processed. The spin chuck 4 and processing cup 14 are disposed in the lower space.

The FFU 12 supplies clean air from the blast port 10b to the upper space. The clean air supplied into the upper space contacts with the baffle plate 13 and diffuses in the upper space. The clean air in the upper space passes through the plurality of through-holes 13a running through the baffle plate 13 in the thickness direction, and flows downward over the entire region of the baffle plate 13. The clean air supplied to the lower space is discharged from the bottom portion of the chamber 9. This causes a uniform flow of clean air downward from the entire region of the baffle plate 13 (downflow) to be formed in the lower space. The downflow is formed at all times regardless of whether or not the substrate W is present in the chamber 9.

The processing cup 14 includes a plurality of splash guards 15 that receive liquid discharged out from the substrate W (a first splash guard 15A, a second splash guard 15B, a third splash guard 15C and a fourth splash guard 15D), and a plurality of cups 16 that receive the liquid that has been guided downward by the splash guards 15.

Each of the splash guards 15 includes a cylindrical tube portion 15b surrounding the spin chuck 4, and a toric ceiling portion 15a extending upward obliquely from the top edge of the tube portion 15b toward the rotational axis A1. The ceiling portion 15a includes a toric upper end that surrounds the substrate W and spin base 5, in a plan view. The plurality of ceiling portions 15a overlap in the vertical direction, and the plurality of tube portions 15b are disposed in a concentric manner. The plurality of cups 16 are each disposed under the plurality of tube portions 15b. The cup 16 forms an annular liquid-receiving groove that opens upward.

The plurality of splash guards 15 are connected to a guard-raising/lowering unit 17 that separately raises and lowers each of the plurality of splash guards 15. The guard-raising/lowering unit 17 raises and lowers the splash guards 15 vertically between an upper position and lower position. The upper position is a position where the upper end of the ceiling portion 15a corresponding to the upper end of the splash guards 15 is located higher than the substrate holding position, and the lower position is a position where the upper end of the ceiling portion 15a is located lower than the substrate holding position.

Each of the plurality of nozzles includes a lower surface nozzle 21 that discharges liquid upward toward the substrate holding position. The lower surface nozzle 21 is connected to a second rinse liquid tube 25 that guides the rinse liquid. A second rinse liquid valve 26 that switches supply and interruption of rinse liquid to the lower surface nozzle 21 is interposed in the second rinse liquid tube 25. A second flow adjusting valve 27 that changes the flow rate of rinse liquid supplied to the lower surface nozzle 21 is also interposed in the second rinse liquid tube 25.

The lower surface nozzle 21 includes a nozzle portion 23 disposed at a height between the upper surface of the spin base 5 and the substrate holding position, and a base portion 24 extending downward from the nozzle portion 23 along the rotational axis A1. The base portion 24 has, for example, a columnar shape running in the vertical direction along the rotational axis A1. The nozzle portion 23 has, for example, a disk shape with a larger outer diameter than the base portion 24. The nozzle portion 23 and base portion 24 are coaxial. The lower discharge port 22 of the lower surface nozzle 21 opens at the upper surface of the nozzle portion 23 that is parallel to the lower surface of the substrate W. The base portion 24 is inserted into a center hole opening at the upper surface center portion of the spin base 5. The lower surface nozzle 21 is anchored with respect to the chamber 9. The lower surface nozzle 21 does not rotate even when the spin base 5 has rotated.

When the second rinse liquid valve 26 is opened, the rinse liquid is continuously discharged upward from the lower discharge port 22 of the lower surface nozzle 21, at a flow rate corresponding to the aperture of the second flow adjusting valve 27. The rinse liquid discharged from the lower surface nozzle 21 is, for example, pure water (deionized water). The rinse liquid is not limited to pure water and may instead be IPA (isopropyl alcohol), electrolytic ion water, hydrogen water, ozone water or hydrochloric acid water at dilute concentration (for example, about 10 to 100 ppm).

While not shown, the second rinse liquid valve 26 includes a valve body forming a flow channel, a valve element disposed in the flow channel, and an actuator that moves the valve element. This also applies to the valve described below. The actuator may be a pneumatic actuator or an electric actuator, or a different type of actuator. The controller 3 opens and closes the second rinse liquid valve 26 by controlling the actuator. The controller 3 also changes the aperture of the second flow adjusting valve 27 by controlling the actuator.

The plurality of nozzles include a plurality of upper surface nozzles 34 (first upper surface nozzle 34A, second upper surface nozzle 34B and third upper surface nozzle 34C) that discharge liquid downward toward the substrate holding position. The first upper surface nozzle 34A is connected to a first chemical liquid tube 28 in which a first chemical liquid valve 29 is interposed. The third upper surface nozzle 34C is connected to a second chemical liquid tube 30 in which a second chemical liquid valve 31 is interposed. The second upper surface nozzle 34B is connected to a first rinse liquid tube 32 in which a first rinse liquid valve 33 is interposed.

Different types of chemical liquids are supplied to the first upper surface nozzle 34A and the third upper surface nozzle 34C. Pure water is supplied as a rinse liquid to the second upper surface nozzle 34B. The chemical liquid supplied to the first upper surface nozzle 34A may be, for example, BHF (a liquid mixture including hydrogen fluoride, ammonium fluoride and water), SPM (a mixture including sulfuric acid and hydrogen peroxide water), or SC1 (a mixture including ammonium hydroxide and hydrogen peroxide water). A chemical liquid other than BHF, SPM and SC1 may also be supplied to the first upper surface nozzle 34A. For example, a liquid including at least one from among sulfuric acid, nitric acid, hydrochloric acid, hydrofluoric acid, phosphoric acid, acetic acid, ammonia water, hydrogen peroxide water, organic acids (such as citric acid or oxalic acid), organic alkalis (such as TMAH: tetramethylammonium hydroxide), surfactants and corrosion inhibitors, may be supplied to the first upper surface nozzle 34A.

As shown in FIG. 2, each upper surface nozzle 34 is held on a holder 42. As shown in FIG. 3, the upper surface nozzle 34 includes a columnar horizontal portion 36 extending from the holder 42 in the horizontal extending direction X1, a columnar corner portion 37 bent downward from the tip of the horizontal portion 36, a columnar dropping portion 38 extending downward from the corner portion 37, and an upper discharge port 35 opening at the lower surface of the dropping portion 38. The members composing the upper surface nozzle 34 include a resin tube 39 that guides the liquid, a core metal 40 with a tubular cross-section, surrounding the resin tube 39, and a resin coating 41 with a tubular cross-section, surrounding the core metal 40.

As shown in FIG. 3, the horizontal portion 36 is longer than the dropping portion 38. The center line of the horizontal portion 36 is horizontal at all positions. The center line of the dropping portion 38 is vertical at all positions. The center line of the corner portion 37 is inclined with respect to the horizontal plane. The corner portion 37 is a convex arc shape oriented obliquely upward, as viewed in the horizontal array direction Y1 perpendicular to the extending direction X1. The corner portion 37 may be L-shaped, or in the shape of a folded line with two or more folds.

The outer peripheral surface of the dropping portion 38 of the upper surface nozzle 34 includes a cylindrical large-diameter portion 38a extending downward vertically from the corner portion 37, a toric step portion 38b extending inward from the bottom end of the large-diameter portion 38a, and a cylindrical small-diameter portion 38c extending downward vertically from the inner peripheral edge of the step portion 38b. The large-diameter portion 38a, step portion 38b and small-diameter portion 38c are coaxial with each other. The diameter of the small-diameter portion 38c is smaller than the diameter of the large-diameter portion 38a. The large-diameter portion 38a and the step portion 38b are portion of the outer peripheral surface of the resin coating 41, and the small-diameter portion 38c is portion of the outer peripheral surface of the resin tube 39.

The plurality of horizontal portions 36 are mutually parallel, and the plurality of dropping portions 38 are also mutually parallel. The plurality of horizontal portions 36 are aligned at equal intervals in the array direction Y1, in order from the first upper surface nozzle 34A to the third upper surface nozzle 34C. Similarly, the plurality of dropping portions 38 are aligned at equal intervals in the array direction Y1, in order from the first upper surface nozzle 34A to the third upper surface nozzle 34C. The plurality of upper discharge ports 35 are disposed at the same height, and aligned in a straight linear fashion in the array direction Y1, in a plan view.

The resin tube 39 forms one flow channel extending along the upper surface nozzle 34. The tip portion 39a of the resin tube 39 protrudes downward from the core metal 40 and the resin coating 41. The upper discharge port 35 opens at the lower surface of the tip portion 39a of the resin tube 39. The resin tube 39 and resin coating 41 are formed of a fluorine resin such as PTFE (polytetrafluoroethylene), for example. PTFE is an example of a hydrophobic material (a material with a water contact angle of greater than 30°). The resin tube 39 and resin coating 41 form the front surface of the upper surface nozzle 34. The surface of the upper surface nozzle 34 is hydrophobic. Either or both the resin tube 39 and resin coating 41 may be formed of a hydrophilic material.

As shown in FIG. 3, the processing unit 2 includes a nozzle moving unit 43 that moves the plurality of upper surface nozzles 34 by moving the holder 42. The nozzle moving unit 43 includes a horizontal driving unit 43a that moves the plurality of upper surface nozzles 34 horizontally by moving the holder 42 horizontally, and a vertical driving unit 43b that moves the plurality of upper surface nozzles 34 vertically by moving the holder 42 vertically.

As shown in FIG. 2, the horizontal driving unit 43a moves the plurality of upper surface nozzles 34 horizontally between the processing positions (the positions indicated by alternate long and two short dashes lines in FIG. 2) and the high standby positions (the positions indicated by solid lines in FIG. 2). The vertical driving unit 43b moves the plurality of upper surface nozzles 34 vertically between the high standby positions and the low standby positions. The processing unit 2 includes a closed-bottom tubular standby pot 44 in which the plurality of upper surface nozzles 34 are inserted, located at the low standby positions. The standby pot 44 is disposed around the processing cup 14, in a plan view.

The horizontal driving unit 43a is a revolving unit that moves the plurality of upper surface nozzles 34 horizontally around a nozzle rotating axis A2 that extends vertically near the processing cup 14. The horizontal driving unit 43a may also be a slide unit that moves the plurality of upper surface nozzles 34 in parallel in the horizontal direction. The horizontal driving unit 43a supports the holder 42 via the vertical driving unit 43b. The horizontal driving unit 43a rotates the vertical driving unit 43b around the nozzle rotating axis A2 to move the holder 42 horizontally. This causes the plurality of upper surface nozzles 34 to move horizontally between the processing positions and the high standby positions.

The "processing positions" are the positions where the plurality of upper surface nozzles 34 and the substrate W overlap in a plan view, and where the processing liquid discharged from the plurality of upper surface nozzles 34 lands on the upper surface of the substrate W. The "high standby positions" are the positions where the plurality of upper surface nozzles 34 have retreated so that the plurality of upper surface nozzles 34 and the substrate W do not overlap in a plan view. The "low standby positions" are the positions directly below the high standby positions. At the high standby positions, the dropping portions 38 of the plurality of upper surface nozzles 34 are located above the standby pot 44. At the low standby positions, the dropping portions 38 of the plurality of upper surface nozzles 34 are inserted in the standby pot 44 (see FIG. 7).

An example of processing of a substrate W by the substrate processing apparatus 1 will now be explained.

FIG. 4 is a flow chart for describing an example of processing of a substrate W carried out by the substrate processing apparatus 1. FIG. 5A to FIG. 5C are schematic views showing the state of the processing unit 2 when each step shown in FIG. 4 is being carried out. The controller 3 is programmed so as to carry out each of the following steps.

When a substrate W is to be processed by the substrate processing apparatus 1, a carry-in step is performed in which the substrate W is carried into the chamber 9 (step S1 of FIG. 4).

Specifically, when the plurality of upper surface nozzles 34 have retreated from above the substrate W, and the first splash guard 15A to fourth splash guard 15D are located at the lower positions, the transfer robot (not shown) inserts its hand into the chamber 9 while supporting the substrate W with the hand. Next, the transfer robot places the substrate W on its hand onto the spin chuck 4, with the front surface of the substrate W facing upward. The spin motor 8 initiates rotation of the substrate W after the substrate W has been gripped by the chuck pin 6. The transfer robot retreats its hand from the interior of the chamber 9 after the substrate W has been placed on the spin chuck 4.

Next, the chemical liquid supply step is performed to supply the chemical liquid to the upper surface of the substrate W, as shown in FIG. 5A (step S2 of FIG. 4).

Specifically, the controller 3 carries out a predispensing step in which the chemical liquid is discharged toward the standby pot 44, through the first upper surface nozzle 34A located at the high standby position or low standby position, and then moves the plurality of upper surface nozzles to the processing positions. In addition, the guard-raising/lowering unit 17 raises the second splash guard 15B to fourth splash guard 15D to the upper positions while the first splash guard 15A is kept at the lower position. The first chemical liquid valve 29 is then opened. This causes the chemical liquid to be discharged from the first upper surface nozzle 34A toward the upper surface of the substrate W that is rotating.

When the first upper surface nozzle 34A is discharging the chemical liquid, the nozzle moving unit 43 may move the plurality of upper surface nozzles 34 between the center processing positions where the chemical liquid that has been discharged from the first upper surface nozzle 34A lands on the upper surface center portion of the substrate W, and the outer perimeter processing positions where chemical liquid that has been discharged from the first upper surface nozzle 34A lands on the upper surface outer periphery of the substrate W, or it may station the plurality of upper surface nozzles 34 so that the liquid landing position of the chemical liquid is located on the upper surface center portion of the substrate W. The first chemical liquid valve 29 is closed when a prescribed period of time has elapsed after opening of the first chemical liquid valve 29.

After having landed on the upper surface of the substrate W, the chemical liquid discharged from the first upper surface nozzle 34A flows outward along the upper surface of the substrate W that is rotating. This causes a liquid film of the chemical liquid to be formed covering the entire region on the upper surface of the substrate W, so that the chemical liquid is supplied over the entire region of the upper surface of the substrate W. In particular, when the nozzle moving unit 43 moves the first upper surface nozzle 34A between the center processing position and the outer perimeter processing position, the entire region of the upper surface of the substrate W is scanned at the chemical liquid landing position, and therefore the chemical liquid is uniformly supplied over the entire region of the upper surface of the substrate W. The upper surface of the substrate W is thus uniformly processed.

Next, as shown in FIG. 5B, a rinse liquid supply step is carried out in which pure water as the rinse liquid is supplied to both the upper surface and the lower surface of the substrate W (step S3 of FIG. 4).

Specifically, while the plurality of upper surface nozzles 34 are located at the processing positions, the guard-raising/lowering unit 17 raises the first splash guard 15A to the upper position while leaving the second splash guard 15B to fourth splash guard 15D at the upper positions. The first rinse liquid valve 33 is then opened. This initiates discharge of pure water by the second upper surface nozzle 34B, as the first rinse liquid nozzle. When the second upper surface nozzle 34B is discharging the pure water, the nozzle moving unit 43 may move the plurality of upper surface nozzles 34 between the center processing positions and the outer perimeter processing positions, or it may station the plurality of upper surface nozzles 34 so that the liquid landing position of the rinse liquid is located on the upper surface center portion of the substrate W.

The pure water that has landed on the upper surface of the substrate W flows outward along the upper surface of the substrate W that is rotating. The chemical liquid on the substrate W is washed off by the pure water that has been discharged from the second upper surface nozzle 34B. This causes a liquid film of the pure water to be formed covering the entire region of the upper surface of the substrate W. The pure water that has reached the upper surface outer periphery of the substrate W splashes from the substrate W to its surrounding area and is received by the first splash guard 15A located at the upper position. Next, the pure water is guided to the cup 16 corresponding to the first splash guard 15A. When a prescribed time period has elapsed after the first rinse liquid valve 33 has been opened, the first rinse liquid valve 33 is closed and discharge of the pure water is stopped. The nozzle moving unit 43 then moves the plurality of upper surface nozzles 34 to the high standby positions.

Meanwhile, the second rinse liquid valve 26 is opened and the lower surface nozzle 21 serving as the second rinse liquid nozzle initiates discharge of pure water. This causes the pure water to be discharged from the lower surface nozzle 21 toward the lower surface center portion of the substrate W that is rotating. The second rinse liquid valve 26 may be opened simultaneously with the first rinse liquid valve 33, or it may be opened before or after the first rinse liquid valve 33 is opened. The pure water that has landed on the lower surface of the substrate W flows outward along the lower surface of the rotating substrate W, and splashes out from the outer periphery of the substrate W to its surrounding area. The mist and the like of the chemical liquid adhering onto the lower surface of the substrate W is washed off by the pure water that has been discharged from the lower surface nozzle 21. When a prescribed time period has elapsed after the second rinse liquid valve 26 has been opened, the second rinse liquid valve 26 is closed and discharge of the pure water is stopped.

Next, as shown in FIG. 5C, a drying step is carried out in which the substrate W is dried by high-speed rotation of the substrate W (step S4 of FIG. 4).

Specifically, the guard-raising/lowering unit 17 lowers the first splash guard 15A to third splash guard 15C to the lower positions while the fourth splash guard 15D is kept at the upper position. The spin motor 8 then accelerates the substrate W in the rotational direction, rotating it at a higher rotational speed than the rotational speed of the substrate W in the chemical liquid supply step and rinse liquid supply step (for example, several thousand rpm). This causes the liquid to be removed from the substrate W, drying the substrate W. When a prescribed time period has elapsed after initiating high-speed rotation of the substrate W, the spin motor 8 stops the rotation. This causes rotation of the substrate W to be halted.

This is followed by a carry-out step in which the substrate W is carried out from the chamber 9 (step S5 of FIG. 4).

Specifically, the guard-raising/lowering unit 17 lowers the fourth splash guard 15D to the lower position while the first splash guard 15A to third splash guard 15C are kept at the lower positions. The transfer robot (not shown) then inserts its hand into the chamber 9. After holding of the substrate W by the plurality of chuck pins 6 has been released, the transfer robot supports the substrate W on the spin chuck 4 by its hand. The transfer robot then retreats its hand from inside the chamber 9 while supporting the substrate W with its hand. This causes the processed substrate W to be carried out from the chamber 9.

A second cleaning nozzle 51 that cleans the plurality of upper surface nozzles 34 will now be explained.

Figure 6:
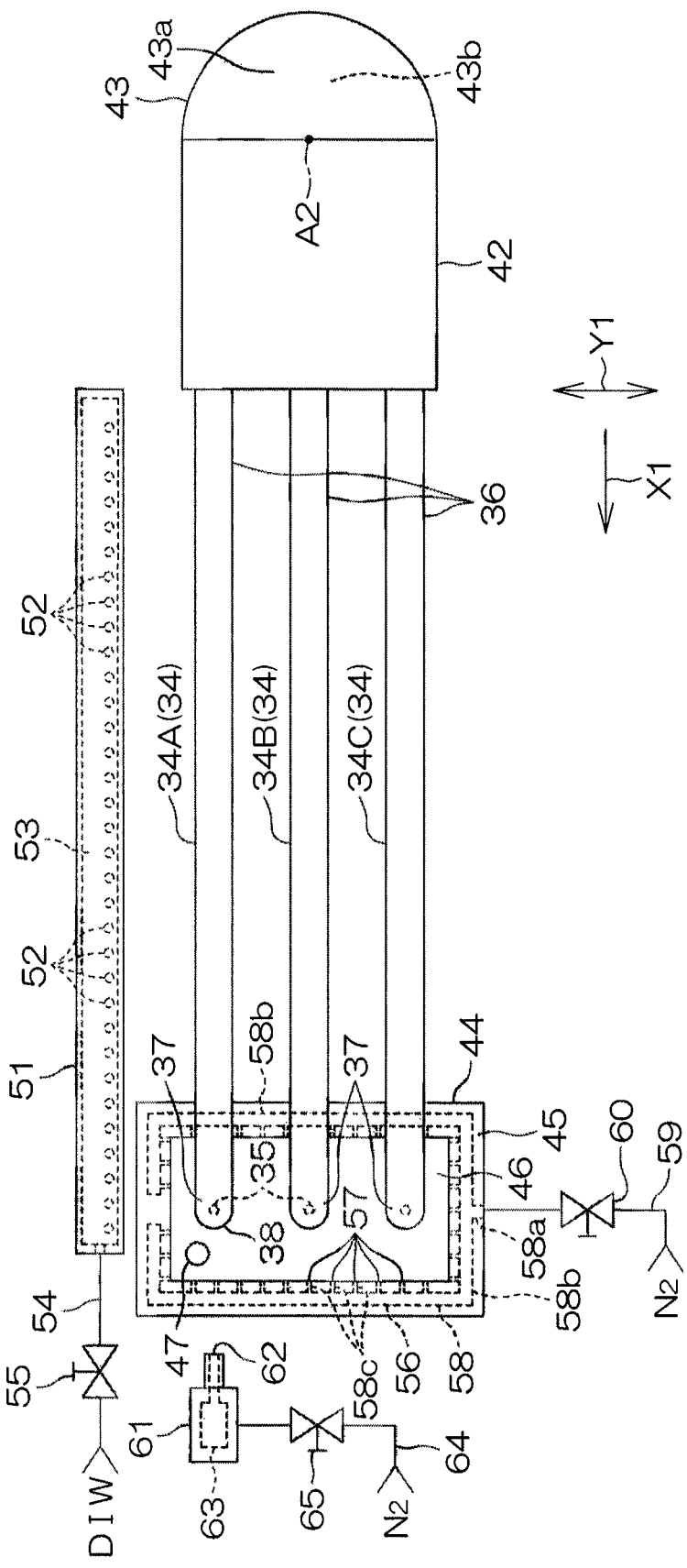
FIG. 6 is a schematic plan view showing a plurality of upper surface nozzles, a second cleaning nozzle, a first drying nozzle and a second drying nozzle.
Figure 7:
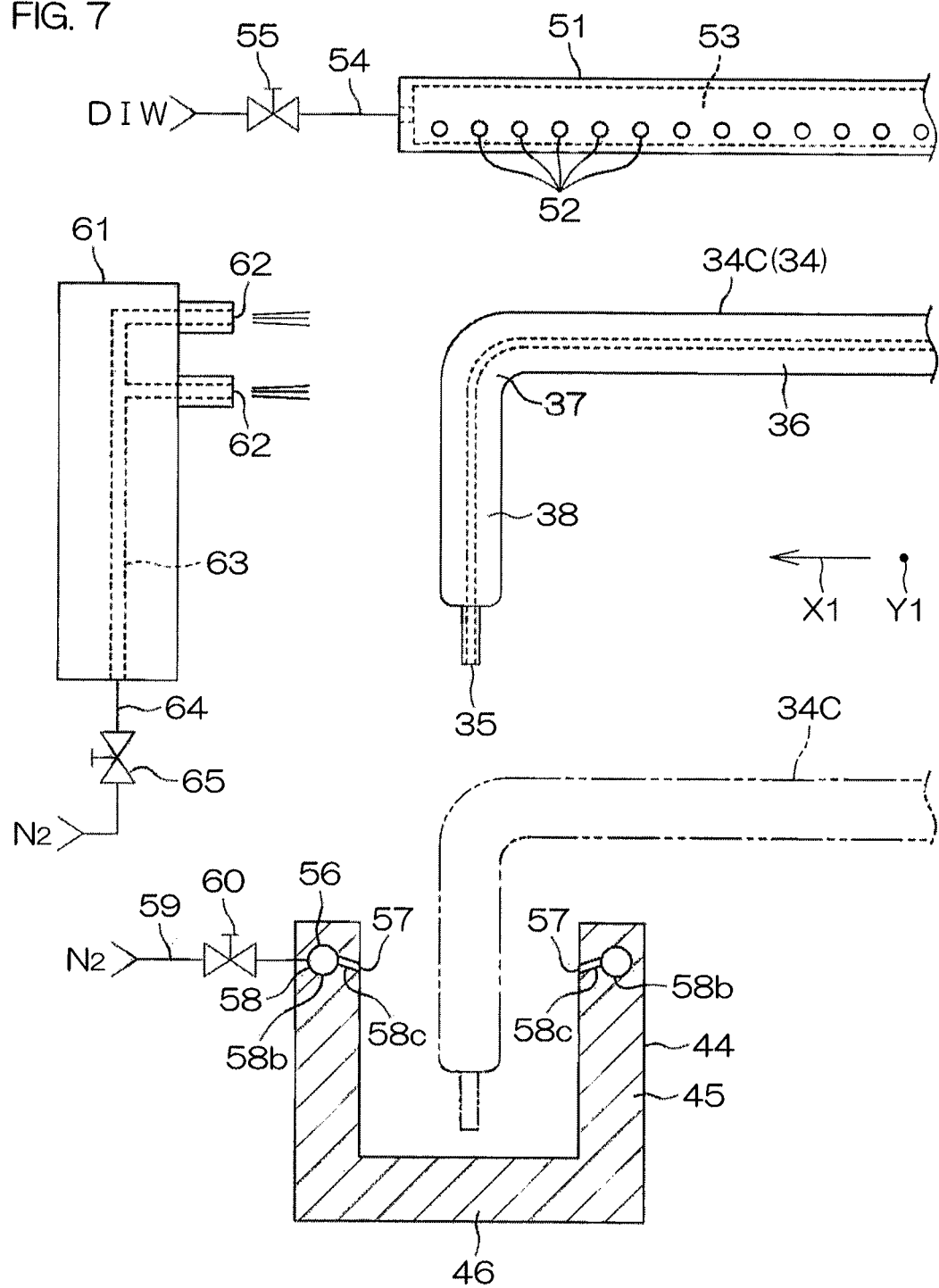
FIG. 7 is a schematic horizontal view of a plurality of upper surface nozzles, a second cleaning nozzle, a first drying nozzle and a second drying nozzle.

FIG. 6 is a schematic plan view showing a plurality of upper surface nozzles 34, a second cleaning nozzle 51, a first drying nozzle 56 and a second drying nozzle 61. FIG. 7 is a schematic horizontal view of a plurality of upper surface nozzles 34, a second cleaning nozzle 51, a first drying nozzle 56 and a second drying nozzle 61. FIG. 6 shows the plurality of upper surface nozzles 34 disposed at the high standby positions. FIG. 7 indicates the plurality of upper surface nozzles 34 located at the high standby positions by solid lines, and the plurality of upper surface nozzles 34 located at the low standby positions by alternate long and two short dashes lines.

As shown in FIG. 7, the processing unit 2 includes the second cleaning nozzle 51 that discharges pure water, serving as the cleaning liquid, toward the plurality of upper surface nozzles 34. The second cleaning nozzle 51 is connected to a second cleaning liquid tube 54 in which a second cleaning liquid valve 55 is interposed. The second cleaning nozzle 51 includes a plurality of second cleaning liquid discharge ports 52 that discharge pure water toward the plurality of upper surface nozzles 34, and a second cleaning liquid supply channel 53 that supplies pure water to the plurality of second cleaning liquid discharge ports 52.

The second cleaning nozzle 51 is disposed higher than the plurality of upper surface nozzles 34 that are located at the high standby positions. The plurality of upper surface nozzles 34 pass under the second cleaning nozzle 51. As shown in FIG. 6, the second cleaning nozzle 51 is disposed at the side of the plurality of upper surface nozzles 34 located at the high standby positions, in a plan view. The second cleaning nozzle 51 extends in the axial direction parallel to the extending direction X1 of the plurality of upper surface nozzles 34 located at the high standby positions. The second cleaning nozzle 51 is disposed on the processing cup 14 side with respect to the plurality of upper surface nozzles 34 located at the high standby positions, in a plan view (see FIG. 2).

The second cleaning nozzle 51 is a shower nozzle that discharges pure water obliquely downward from the plurality of second cleaning liquid discharge ports 52. The plurality of second cleaning liquid discharge ports 52 are aligned in a straight linear fashion at equal intervals in the axial direction of the second cleaning nozzle 51. The second cleaning nozzle 51 discharges pure water to form a sheet-like liquid stream flowing obliquely downward from the second cleaning nozzle 51. The second cleaning nozzle 51 may discharge the pure water so as to form a fixed liquid stream thickness, or it may discharge the pure water so that the thickness of the liquid stream increases as it separates from the second cleaning nozzle 51.

Regardless of where the plurality of upper surface nozzles 34 are located from the high standby positions to the low standby positions, the horizontal portion 36, corner portion 37 and dropping portion 38 of the first upper surface nozzle 34A is still visible as viewed from the second cleaning nozzle 51. On the other hand, the horizontal portion 36, corner portion 37 and dropping portion 38 of the second upper surface nozzle 34B and the horizontal portion 36, corner portion 37 and dropping portion 38 of the third upper surface nozzle 34C, are hidden by the horizontal portion 36, corner portion 37 and dropping portion 38 of the first upper surface nozzle 34A as viewed from the second cleaning nozzle 51.

When the plurality of upper surface nozzles 34 are to be cleaned by pure water discharged from the second cleaning nozzle 51, the controller 3 raises and lowers the plurality of upper surface nozzles 34 in the nozzle moving unit 43 between the high standby positions and the low standby positions. At the high standby positions, pure water discharged from the second cleaning nozzle 51 contacts mainly with the horizontal portion 36 of the first upper surface nozzle 34A (see the first upper surface nozzle 34A indicated by an alternate long and two short dashes line in FIG. 13). At the low standby positions, pure water discharged from the second cleaning nozzle 51 contacts mainly with the horizontal portion 36 of the third upper surface nozzle 34C (see the third upper surface nozzle 34C indicated by a solid line in FIG. 13). When the plurality of upper surface nozzles 34 move between the high standby positions and the low standby positions, the plurality of upper surface nozzles 34 pass through the sheet-like liquid stream in order. This causes the pure water discharged from the second cleaning nozzle 51 to be supplied to the horizontal portions 36 of all of the upper surface nozzles 34.

The first drying nozzle 56 that dries the dropping portions 38 of the plurality of upper surface nozzles 34 will now be explained.

As shown in FIG. 6, the first drying nozzle 56 includes a plurality of first gas discharge ports 57 that discharge nitrogen gas, serving as a drying gas, into the standby pot 44, and a first gas supply channel 58 that supplies nitrogen gas to a plurality of first gas discharge ports 57. The first gas supply channel 58 is connected to a first gas tube 59 in which a first gas valve 60 is interposed.

As shown in FIG. 7, the standby pot 44 includes a tubular perimeter wall 45 surrounding the dropping portions 38 of the plurality of upper surface nozzles 34 located at the low standby positions (the positions indicated by alternate long and two short dashes lines in FIG. 7), and a bottom wall 46 that closes the bottom end of the perimeter wall 45. The bottom surface of the standby pot 44 extends obliquely downward toward a discharge hole 47 that opens at the bottom surface of the standby pot 44 (see FIG. 6). The liquid in the standby pot 44 is discharged from the discharge hole 47.

The first gas discharge port 57 opens at the inner peripheral surface of the standby pot 44. The plurality of first gas discharge ports 57 are arranged in the circumferential direction of the standby pot 44. The plurality of first gas discharge ports 57 discharge nitrogen gas in two or more different directions, in a plan view. The first gas supply channel 58 is provided inside the perimeter wall 45 of the standby pot 44. As shown in FIG. 6, the first gas supply channel 58 includes a first gas passage 58a that guides nitrogen gas that has been supplied to the plurality of first gas discharge ports 57, two second gas passages 58b branching from the first gas passage 58a, and a plurality of third gas passages 58c branching from the two second gas passages 58b.

When the first gas valve 60 is opened, a plurality of gas streams flowing in from the plurality of first gas discharge ports 57 are formed inside the standby pot 44. The first gas discharge port 57 discharges nitrogen gas that has been supplied from the first gas supply channel 58, to form a linear gas stream flowing in from the first gas discharge port 57. The third gas passages 58c of the first gas supply channel 58 extend obliquely downward toward the first gas discharge port 57. The first gas discharge port 57 discharges nitrogen gas obliquely downward. The first gas discharge port 57 may discharge nitrogen gas horizontally, or it may discharge nitrogen gas obliquely upward.

The second drying nozzle 61 that dries the horizontal portions 36 of the plurality of upper surface nozzles 34 will now be explained.

As shown in FIG. 7, the processing unit 2 includes a second drying nozzle 61 that discharges nitrogen gas, serving as the drying gas, toward the plurality of upper surface nozzles 34. The second drying nozzle 61 is connected to the second gas tube 64 in which a second gas valve 65 is interposed. The second drying nozzle 61 includes a plurality of second gas discharge ports 62 (for example, two) that discharge nitrogen gas toward the plurality of upper surface nozzles 34, and a second gas supply channel 63 that supplies nitrogen gas to the plurality of second gas discharge ports 62.

As shown in FIG. 6, the second gas discharge ports 62 horizontally face the dropping portion 38 of the first upper surface nozzle 34A located at the high standby position. The second gas discharge ports 62 are disposed on the opposite side from the horizontal portion 36 with respect to the dropping portion 38. As shown in FIG. 7, when the plurality of upper surface nozzles 34 are located at the high standby positions, the upper second gas discharge port 62 is disposed at the same height as the horizontal portion 36, while the lower second gas discharge port 62 is disposed at the same height as the corner portion 37. The second gas discharge ports 62 are disposed higher than the standby pot 44. The second drying nozzle 61 is located around the processing cup 14, in a plan view (see FIG. 2).

The second drying nozzle 61 may be a nozzle forming a linear gas stream, or it may be a nozzle forming a conical gas stream with an increasing diameter as it separates from the second drying nozzle 61. When the plurality of upper surface nozzles 34 are located at the high standby positions, the nitrogen gas that has been discharged from the upper second gas discharge port 62 contacts the corner portion 37 of the first upper surface nozzle 34A and flows to the bottom side of the horizontal portion 36, along the upper edge of the horizontal portion 36 of the first upper surface nozzle 34A. The nitrogen gas that has been discharged from the lower second gas discharge port 62 contacts the corner portion 37 of the first upper surface nozzle 34A and flows to the bottom side of the horizontal portion 36, along the lower edge of the horizontal portion 36 of the first upper surface nozzle 34A.

Figure 15:
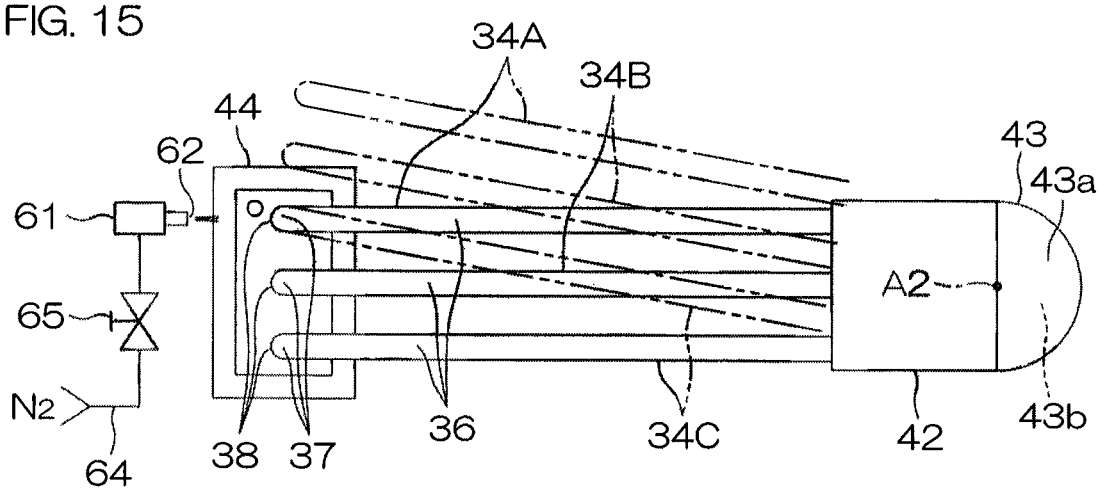
FIG. 15 is a schematic plan view showing the state of nitrogen gas discharged from the second drying nozzle, being supplied to the horizontal portions of the plurality of upper surface nozzles.

When the plurality of upper surface nozzles 34 are to be dried with nitrogen gas discharged from the second drying nozzle 61, the controller 3 moves the plurality of upper surface nozzles 34 horizontally in the nozzle moving unit 43, around the nozzle rotating axis A2, between the two return positions (see FIG. 15). The two return positions are both positions of equal heights with the processing positions and the high standby positions. The first return positions (the positions indicated by solid lines in FIG. 15) are high standby positions, for example, and the second return positions (the positions indicated by alternate long and two short dashes lines in FIG. 15) are positions between the processing positions and high standby positions, for example.

At the first return positions, the nitrogen gas that has been discharged from the second drying nozzle 61 contacts mainly with the horizontal portion 36 and corner portion 37 of the first upper surface nozzle 34A. At the second return positions, the nitrogen gas that has been discharged from the second drying nozzle 61 contacts mainly with the horizontal portion 36 and corner portion 37 of the third upper surface nozzle 34C. When the plurality of upper surface nozzles 34 move between the first return positions and the second return positions, the positions where the nitrogen gas contacts on the plurality of upper surface nozzles 34 move horizontally. This causes the nitrogen gas discharged from the second drying nozzle 61 to be supplied to the horizontal portions 36 and the corner portions 37 of all of the upper surface nozzles 34.

Cleaning and drying of the upper surface nozzle 34 will now be explained.

Figure 8:
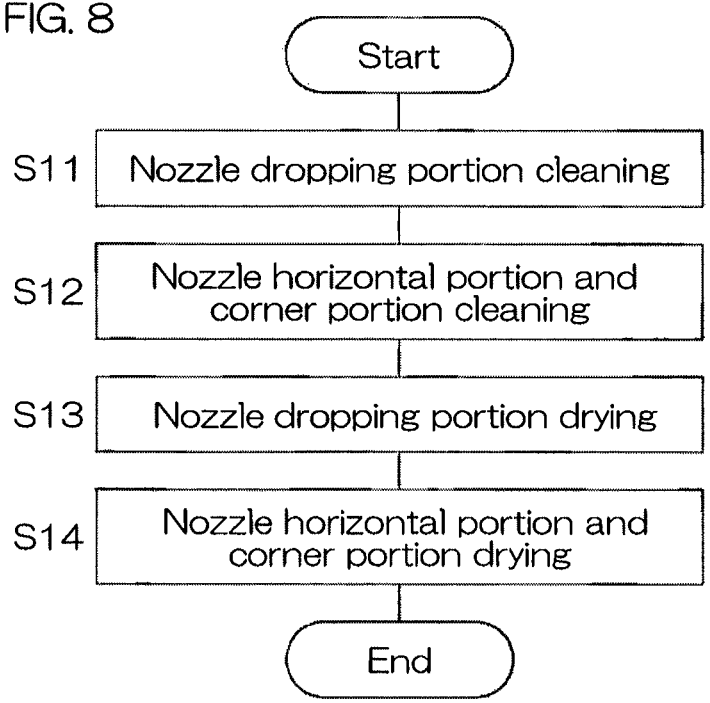
FIG. 8 is a flow chart for describing an example of cleaning and drying of a plurality of upper surface nozzles as carried out by a substrate processing apparatus.

The following explanation refers to FIG. 8 to FIG. 14. FIG. 8 is a flow chart for describing an example of cleaning and drying of a plurality of upper surface nozzles 34 as carried out by a substrate processing apparatus 1. The controller 3 is programmed so as to carry out each of the following steps. Cleaning and drying of the upper surface nozzles 34 may be carried out each time processing of a single substrate W is completed, or it may be carried out each time processing of a plurality of substrates W is completed, or it may be carried out at a prescribed time interval.

When the plurality of upper surface nozzles 34 are cleaned, a dropping portion cleaning step is carried out in which the dropping portions 38 of the plurality of upper surface nozzles 34 are cleaned by pure water discharged from the lower surface nozzle 21 serving as the first cleaning nozzle (step S11 of FIG. 8).

Specifically, while the substrate W is not held by the spin chuck 4, the nozzle moving unit 43 positions the plurality of upper surface nozzles 34 at the processing positions, and the guard-raising/lowering unit 17 positions the first splash guard 15A to fourth splash guard 15D at the upper positions. Also, the spin motor 8 rotates the spin base 5. In this state, the second rinse liquid valve 26 is opened, and the pure water is discharged upward from the lower discharge port 22 of the lower surface nozzle 21.

Figure 9:
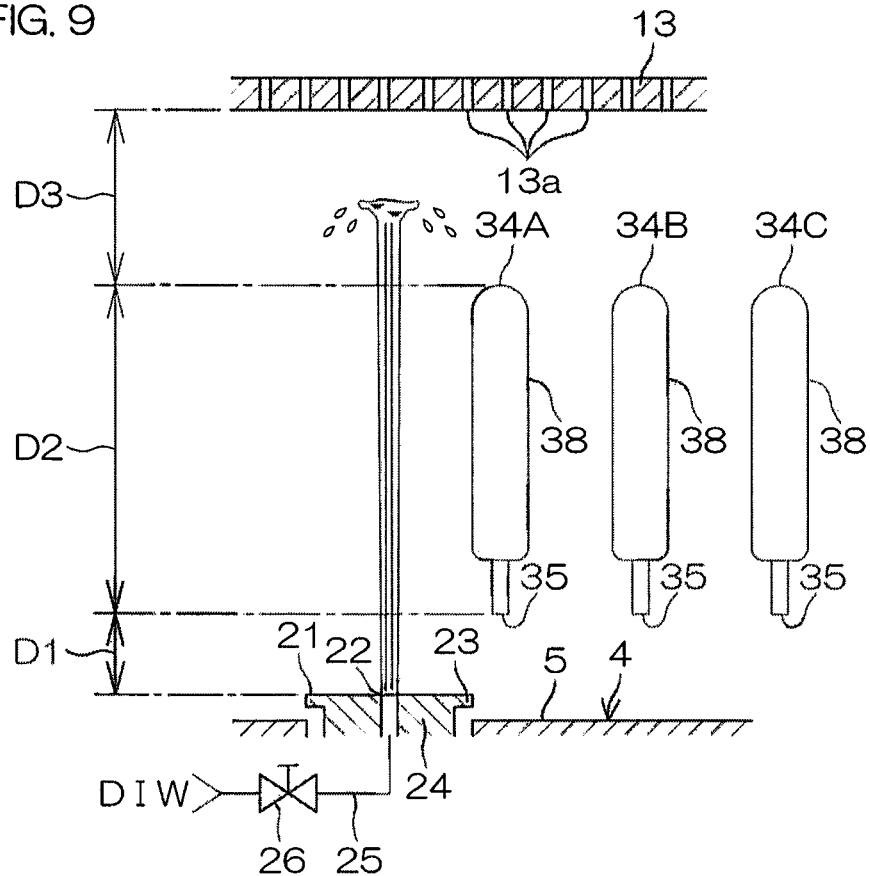
FIG. 9 is a schematic view showing a liquid column extending upward from a lower surface nozzle.

FIG. 9 is a schematic view showing a liquid column extending upward from a lower surface nozzle 21. The pure water discharged from the lower discharge port 22 splashes upward from the lower discharge port 22 in the vertical direction, and then falls down to the uppermost position. This causes a liquid column to be formed extending from the lower discharge port 22 to the uppermost position. As shown in FIG. 9, the flow rate of pure water discharged from the lower surface nozzle 21 is set so that the upper end of the liquid column is located higher than the lower edges of the horizontal portions 36 of the plurality of upper surface nozzles 34 and lower than the lower surface of the baffle plate 13. The flow rate of the pure water may be 1000 to 2000 ml/min, for example. The diameter of the liquid column is approximately equal to the diameter of the lower discharge port 22 of the lower surface nozzle 21, not counting the top edge of the liquid column. At the top edge of the liquid column, the diameter of the liquid column increases due to the effects of gravity and downflow wind pressure. The diameter of the liquid column at the top edge of the liquid column may be larger than the outer diameter of the upper surface nozzle 34.

The pure water that has been discharged upward from the lower surface nozzle 21 spreads out on the upper surface of the spin base 5 after having fallen onto the upper surface of the lower surface nozzle 21. The pure water flows outward along the upper surface of the rotating spin base 5. This causes the upper surface of the spin base 5 to be cleaned by the pure water. In addition, some of the pure water flowing along the upper surface of the spin base 5, after having contacted the chuck pin 6, splashes outward from the outer periphery of the spin base 5. The remaining pure water mainly passes between the plurality of chuck pins 6 and splashes outward from the outer periphery of the spin base 5. The pure water that has been discharged from the spin base 5 is received by the first splash guard 15A and guided to the cup 16 corresponding to the first splash guard 15A. This causes the first splash guard 15A and the cup 16 to be cleaned by the pure water.

FIG. 10A to FIG. 10C are schematic plan views showing the positions of the plurality of upper surface nozzles 34 when the dropping portions 38 of the plurality of upper surface nozzles 34 are cleaned. FIG. 10A, FIG. 10B and FIG. 10C show the states of the plurality of upper surface nozzles 34 located at the first positions, the second positions and the third positions, respectively. While the lower surface nozzle 21 is discharging pure water, the nozzle moving unit 43 horizontally reciprocates the plurality of upper surface nozzles 34 between the first positions and the second positions (first dropping portion cleaning step). Next, while the lower surface nozzle 21 is discharging pure water, the nozzle moving unit 43 horizontally reciprocates the plurality of upper surface nozzles 34 between the second positions and the third positions (second dropping portion cleaning step).

The first positions to third positions are all positions where the upper discharge ports 35 of all of the upper surface nozzles 34 overlap with the spin chuck 4 in a plan view, and the upper discharge ports 35 of all of the upper surface nozzles 34 do not overlap with the lower discharge ports 22 of the lower surface nozzles 21 in a plan view. The "first positions" are the positions where the upper discharge ports 35 of all of the upper surface nozzles 34 are arranged on the high standby position side with respect to the lower discharge ports 22 of the lower surface nozzles 21, in a plan view. The "second positions" are the positions where the lower discharge ports 22 of the lower surface nozzles 21 are arranged between the upper discharge port 35 of the first upper surface nozzle 34A and the upper discharge port 35 of the second upper surface nozzle 34B, in a plan view. The "third positions" are the positions where the upper discharge ports 35 of all of the upper surface nozzles 34 are arranged on the opposite side from the high standby position side with respect to the lower discharge ports 22 of the lower surface nozzles 21, in a plan view.

Figure 11A:
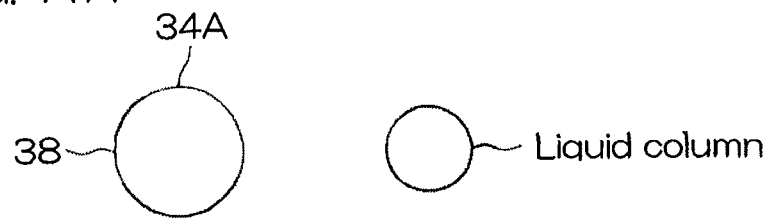
FIG. 11A shows the state of the dropping portion of the first upper surface nozzle before passing through the liquid column.
Figure 11B:
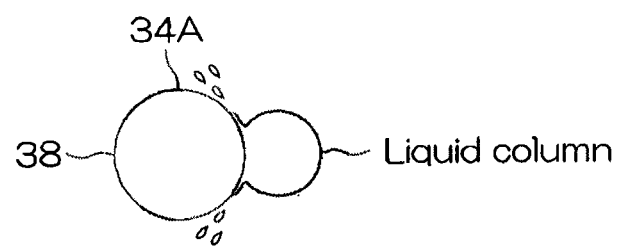
FIG. 11B shows the state of the dropping portion of the first upper surface nozzle immediately after contacting the liquid column.
Figure 11C:
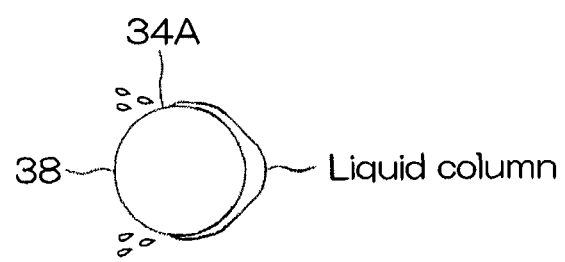
FIG. 11C shows the state of the dropping portion of the first upper surface nozzle as it contacts the liquid column.
Figure 11D:
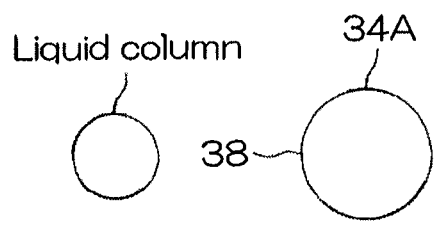
FIG. 11D shows the state of the dropping portion of the first upper surface nozzle after it has passed through the liquid column.

FIG. 11A to FIG. 11D are schematic views showing the state before and after the dropping portion 38 of the first upper surface nozzle 34A passes through the liquid column that extends upward from the lower surface nozzle 21. FIG. 11A shows the state of the dropping portion 38 of the first upper surface nozzle 34A before it passes through the liquid column. FIG. 11B shows the state of the dropping portion 38 of the first upper surface nozzle 34A immediately after it has contacted the liquid column. FIG. 11C shows the state of the dropping portion 38 of the first upper surface nozzle 34A as it contacts the liquid column. FIG. 11D shows the state of the dropping portion 38 of the first upper surface nozzle 34A after it has passed through the liquid column.

As shown in FIG. 11A, at the first positions, the plurality of upper surface nozzles 34 are separated from the liquid column. As shown in FIG. 11B and FIG. 11C, when the plurality of upper surface nozzles 34 move from the first positions to the second positions, one side portion of the dropping portion 38 of the first upper surface nozzle 34A contacts with the liquid column. As shown in FIG. 11D, the dropping portion 38 of the first upper surface nozzle 34A then passes horizontally through the liquid column, and separates from the liquid column. Conversely, when the plurality of upper surface nozzles 34 move from the second positions to the first positions, the other side portion of the dropping portion 38 of the first upper surface nozzle 34A contacts with the liquid column, and the dropping portion 38 of the first upper surface nozzle 34A passes horizontally through the liquid column.

When the plurality of upper surface nozzles 34 reciprocate between the first positions and the second positions, both side portions of the dropping portion 38 of the first upper surface nozzle 34A alternately contact with the liquid column. This causes the pure water that has been discharged from the lower surface nozzle 21 to be supplied to both side portions of the dropping portion 38 of the first upper surface nozzle 34A. In addition, the pure water that has been supplied to the dropping portion 38 of the first upper surface nozzle 34A flows downward along the dropping portion 38 of the first upper surface nozzle 34A, while also flowing along the dropping portion 38 of the first upper surface nozzle 34A, in the direction opposite from the movement direction of the first upper surface nozzle 34A. This causes the pure water to also be supplied to the portion of the dropping portion 38 of the first upper surface nozzle 34A that has not contacted the liquid column.

Furthermore, when the plurality of upper surface nozzles 34 reciprocate between the second positions and the third positions, one side portion of the dropping portion 38 of the second upper surface nozzle 34B contacts with the liquid column, after which one side portion of the dropping portion 38 of the third upper surface nozzle 34C contacts with the liquid column. Next, the other side portion of the dropping portion 38 of the third upper surface nozzle 34C contacts with the liquid column, after which the other side portion of the dropping portion 38 of the second upper surface nozzle 34B contacts with the liquid column. This causes the outer peripheral surface of the dropping portion 38 of the second upper surface nozzle 34B and the outer peripheral surface of the dropping portion 38 of the third upper surface nozzle 34C to be cleaned.

Figure 12A:
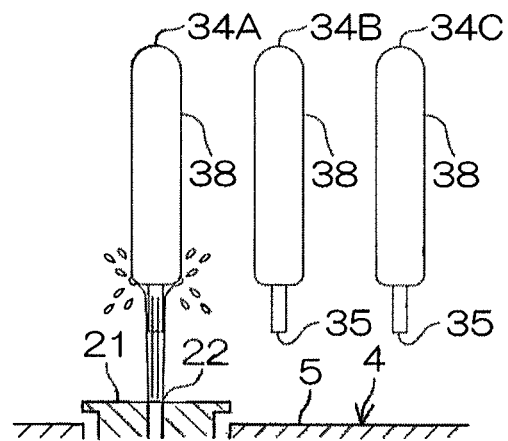
FIG. 12A is a schematic view showing the state of pure water being supplied to the interior of the first upper surface nozzle.
Figure 12B:
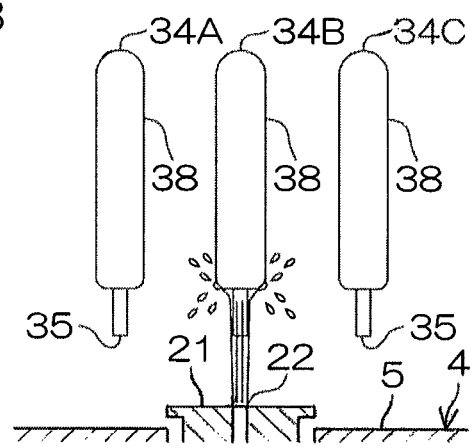
FIG. 12B is a schematic view showing the state of pure water being supplied to the interior of the second upper surface nozzle.
Figure 12C:
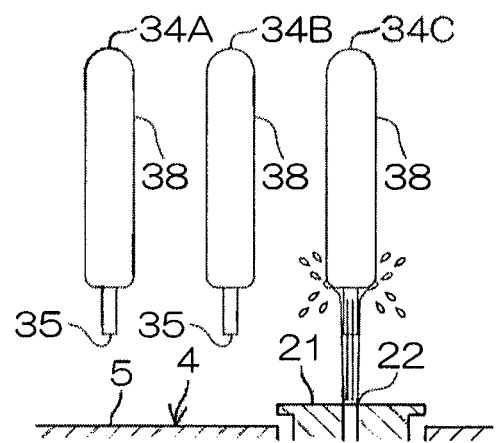
FIG. 12C is a schematic view showing the state of pure water being supplied to the interior of the third upper surface nozzle.

FIG. 12A to FIG. 12C are schematic views showing the state of pure water discharged from the lower surface nozzle 21, being supplied to the interior of one of the plurality of upper surface nozzles 34. FIG. 12A shows the state in which the plurality of upper surface nozzles 34 are located at the first middle position where the pure water that has been discharged from the lower surface nozzle 21 is supplied into the first upper surface nozzle 34A. FIG. 12B shows the state in which the plurality of upper surface nozzles 34 are located at the second middle position where the pure water that has been discharged from the lower surface nozzle 21 is supplied into the second upper surface nozzle 34B. FIG. 12C shows the state in which the plurality of upper surface nozzles 34 are located at the third middle position where the pure water that has been discharged from the lower surface nozzle 21 is supplied into the third upper surface nozzle 34C.

When the plurality of upper surface nozzles 34 reciprocate between the first positions and the second positions, the plurality of upper surface nozzles 34 pass through the first middle position between the first positions and the second positions. The first middle position is the position where the upper discharge port 35 of the first upper surface nozzle 34A overlaps with the lower discharge port 22 of the lower surface nozzle 21, in a plan view. In addition, when the plurality of upper surface nozzles 34 reciprocate between the second positions and the third positions, the plurality of upper surface nozzles 34 pass through the second middle position between the second positions and the third positions, and the third middle position between the second middle position and the third positions. The second middle position is the position where the upper discharge port 35 of the second upper surface nozzle 34B overlaps with the lower discharge port 22 of the lower surface nozzle 21 in a plan view, and the third middle position is the position where the upper discharge port 35 of the third upper surface nozzle 34C overlaps with the lower discharge port 22 of the lower surface nozzle 21 in a plan view.

As shown in FIG. 12A, when the first upper surface nozzle 34A is located at the first middle position, the pure water that has been discharged from the lower surface nozzle 21 contacts the lower surface of the dropping portion 38 that forms the upper discharge port 35 of the first upper surface nozzle 34A. In addition, the pure water that has been discharged from the lower surface nozzle 21 enters into the first upper surface nozzle 34A via the upper discharge port 35 of the first upper surface nozzle 34A. The chemical liquid or its crystals inside the first upper surface nozzle 34A is discharged downward from the upper discharge port 35, together with the pure water that has entered into the first upper surface nozzle 34A. This causes the lower surface of the dropping portion 38 of the first upper surface nozzle 34A and the interior of the first upper surface nozzle 34A to be cleaned.

Similarly, as shown in FIG. 12B, when the second upper surface nozzle 34B is located at the second middle position, the pure water that has been discharged from the lower surface nozzle 21 is supplied to the lower surface of the dropping portion 38 of the second upper surface nozzle 34B and the upper discharge port 35 of the second upper surface nozzle 34B. As shown in FIG. 12C, when the third upper surface nozzle 34C is located at the third middle position, the pure water that has been discharged from the lower surface nozzle 21 is supplied to the lower surface of the dropping portion 38 of the third upper surface nozzle 34C and the upper discharge port 35 of the third upper surface nozzle 34C. This causes the lower surface of the dropping portion 38 of the second upper surface nozzle 34B and the interior of the second upper surface nozzle 34B to be cleaned, and causes the lower surface of the dropping portion 38 of the third upper surface nozzle 34C and the interior of the third upper surface nozzle 34C to be cleaned.

Thus, since the pure water is reliably supplied not only to the interiors of the plurality of upper surface nozzles 34 but also to the outer peripheral surfaces of the dropping portions 38, both the interiors and the outer peripheral surfaces of the plurality of upper surface nozzles 34 can be reliably cleaned. In addition, since the plurality of upper surface nozzles 34 are cleaned using the lower surface nozzle 21 that discharges liquid toward the lower surface of the substrate W, there is no need to provide a separate nozzle to supply cleaning liquid to the plurality of upper surface nozzles 34. Furthermore, since it is possible to clean two nozzles (the second upper surface nozzle 34B and the third upper surface nozzle 34C) by reciprocating the plurality of upper surface nozzles 34 between the second positions and the third positions, the cleaning time can be shortened, compared to cleaning one nozzle at a time.

The number of reciprocations of the plurality of upper surface nozzles 34 between the first positions and second positions (first number of times) may be equal to, more than or less than the number of reciprocations of the plurality of upper surface nozzles 34 between the second positions and third positions (second number of times). When the first upper surface nozzle 34A is more likely to be fouled than the second upper surface nozzle 34B and the third upper surface nozzle 34C, the first number of times may be greater than the second number of times to allow more reliable cleaning of the first upper surface nozzle 34A. On the other hand, when the second upper surface nozzle 34B and third upper surface nozzle 34C are less likely to be fouled than the first upper surface nozzle 34A, the second upper surface nozzle 34B and the third upper surface nozzle 34C can be reliably cleaned even with a small number of reciprocations.

When a prescribed time period elapses after the second rinse liquid valve 26 has been opened, the second rinse liquid valve 26 is closed and discharge of the pure water from the lower surface nozzle 21 is stopped. In addition, rotation of the spin motor 8 is stopped and the first splash guard 15A to fourth splash guard 15D become positioned at the lower positions. This completes the dropping portion cleaning step that includes the first and second dropping portion cleaning steps. Next, a horizontal portion cleaning step is carried out in which the horizontal portions 36 of the plurality of upper surface nozzles 34 are cleaned by pure water that has been discharged from the second cleaning nozzle 51 (step S12 of FIG. 8).

Figure 13:
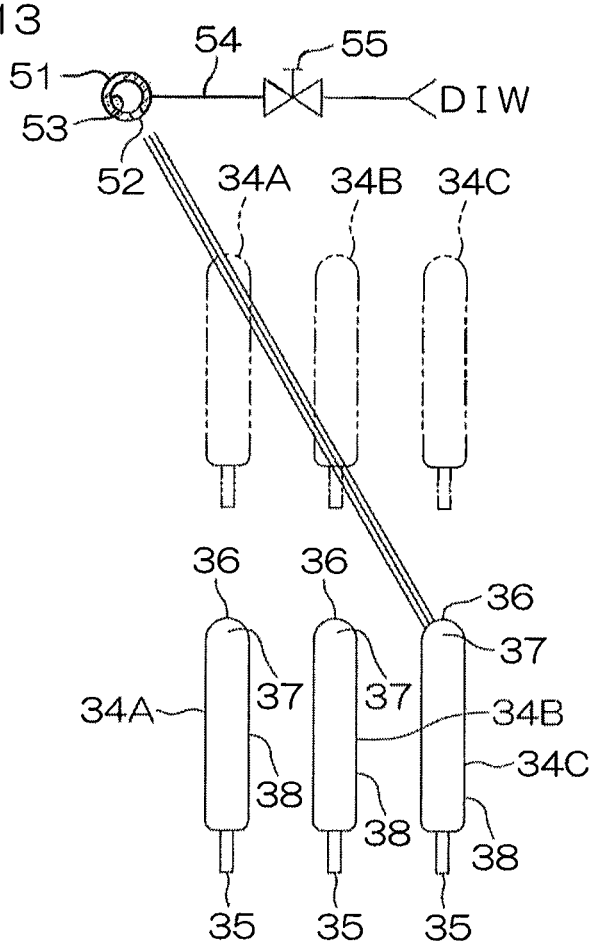
FIG. 13 is a schematic view showing the state of pure water discharged from the second cleaning nozzle, being supplied to the horizontal portions of the plurality of upper surface nozzles.

Specifically, the nozzle moving unit 43 moves the plurality of upper surface nozzles 34 to the high standby positions. The second cleaning liquid valve 55 is then opened. FIG. 13 is a schematic view showing the state of pure water discharged from the second cleaning nozzle 51, being supplied to the horizontal portions 36 of the plurality of upper surface nozzles 34. As shown in FIG. 13, when the second cleaning liquid valve 55 is opened, the second cleaning nozzle 51 initiates discharge of the pure water. A sheet-like liquid stream is therefore formed, flowing obliquely downward from the second cleaning nozzle 51. In this state, the nozzle moving unit 43 raises and lowers the plurality of upper surface nozzles 34 between the high standby positions and the low standby positions.

As shown in FIG. 13, when the second cleaning nozzle 51 discharges the pure water, and the plurality of upper surface nozzles 34 move between the high standby positions (the positions indicated by alternate long and two short dashes lines) and the low standby positions (the positions indicated by solid lines), the plurality of upper surface nozzles 34 pass vertically through the sheet-like liquid stream in order. This causes the pure water discharged from the second cleaning nozzle 51 to be supplied to the horizontal portions 36 and the corner portions 37 of all of the upper surface nozzles 34. In addition, the pure water that has been supplied to the horizontal portions 36 flows downward along the horizontal portions 36, and falls from the lower edges of the horizontal portions 36. The pure water supplied to the corner portions 37 flows from the corner portions 37 to the dropping portions 38, and falls from the lower ends of the dropping portions 38. Consequently, the pure water is also supplied to the parts of the horizontal portions 36 and corner portions 37 that have not directly contacted the sheet-like liquid stream. This allows a wider region of the plurality of upper surface nozzles 34 to be cleaned.

Thus, the horizontal portions 36 and corner portions 37 of the plurality of upper surface nozzles 34 are cleaned by the pure water that has been discharged from the second cleaning nozzle 51. When a prescribed time period has elapsed after opening of the second cleaning liquid valve 55, the nozzle moving unit 43 halts raising and lowering of the plurality of upper surface nozzles 34, disposing the plurality of upper surface nozzles 34 at the high standby positions. The second cleaning liquid valve 55 is then closed, and discharge of pure water from the second cleaning nozzle 51 is interrupted. This completes the horizontal portion cleaning step.

Next, a dropping portion drying step is carried out in which the dropping portions 38 of the plurality of upper surface nozzles 34 are dried with nitrogen gas that has been discharged from the first drying nozzle 56 (step S13 of FIG. 8).

Figure 14:
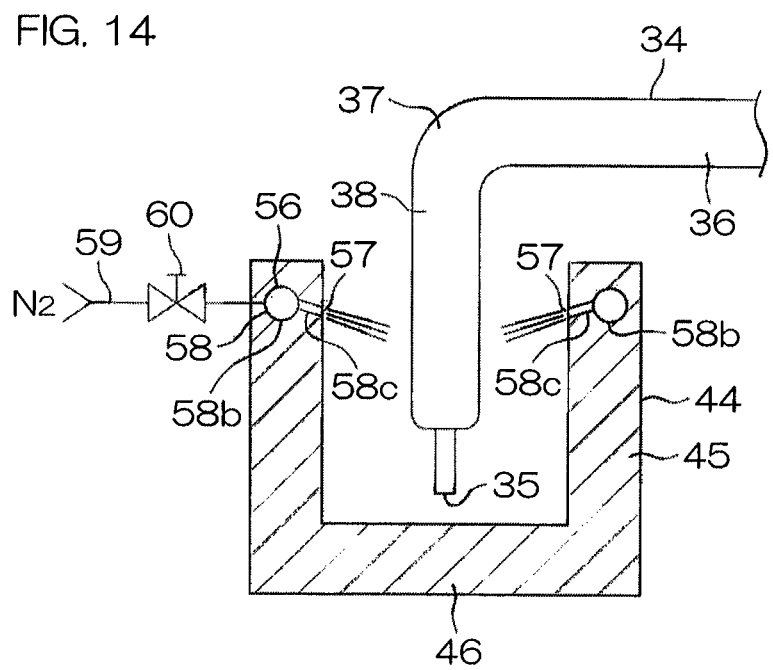
FIG. 14 is a schematic view showing the state of nitrogen gas discharged from the first drying nozzle, being supplied to the dropping portions of the plurality of upper surface nozzles.

Specifically, the first gas valve 60 is opened. FIG. 14 is a schematic view showing the state of nitrogen gas discharged from the first drying nozzle 56, being supplied to the dropping portions 38 of the plurality of upper surface nozzles 34. As shown in FIG. 14, when the first gas valve 60 is opened, the plurality of first gas discharge ports 57 that open at the inner side of the standby pot 44 initiate discharge of nitrogen gas. Consequently, a linear gas stream flowing inward from the first gas discharge port 57 is formed in the standby pot 44. In this state, the nozzle moving unit 43 raises and lowers the plurality of upper surface nozzles 34 between the high standby positions and the low standby positions.

When the plurality of upper surface nozzles 34 enter the standby pot 44, and when they exit the standby pot 44, the dropping portions 38 of the plurality of upper surface nozzles 34 pass vertically through the plurality of gas streams. The nitrogen gas that has been discharged from the first gas discharge port 57 directly impacts the dropping portions 38 of the plurality of upper surface nozzles 34 that are raised and lowered between the high standby positions and the low standby positions. The position where the nitrogen gas impacts the dropping portions 38 moves vertically with raising and lowering of the plurality of upper surface nozzles 34. This causes the nitrogen gas to be directly blown onto the dropping portions 38 of the plurality of upper surface nozzles 34. In particular, since the plurality of first gas discharge ports 57 discharge nitrogen gas in two or more different directions in a plan view, it is possible to cause the nitrogen gas to directly impact a wider region of the plurality of upper surface nozzles 34.

Thus, the nitrogen gas that has been discharged from the first gas discharge port 57 is blown onto the plurality of upper surface nozzles 34, and the liquid such as pure water is removed from the plurality of upper surface nozzles 34. Also, when a prescribed time period has elapsed after opening of the first gas valve 60, the nozzle moving unit 43 halts raising and lowering of the plurality of upper surface nozzles 34, disposing the plurality of upper surface nozzles 34 at the high standby positions. The first gas valve 60 is then closed, and discharge of the nitrogen gas from the first gas discharge port 57 is interrupted. This completes the dropping portion drying step.

Next, a horizontal portion drying step is carried out in which the horizontal portions 36 and corner portions 37 of the plurality of upper surface nozzles 34 are dried with nitrogen gas that has been discharged from the second drying nozzle 61 (step S14 of FIG. 8).

Specifically, the second gas valve 65 is opened. FIG. 15 is a schematic plan view showing the state of nitrogen gas discharged from the second drying nozzle 61, being supplied to the horizontal portions 36 of the plurality of upper surface nozzles 34. As shown in FIG. 15, when the second gas valve 65 is opened, the second drying nozzle 61 initiates discharge of nitrogen gas. Thus, a linear gas stream is formed flowing from the second gas discharge ports 62 toward the plurality of upper surface nozzles 34.

FIG. 15 indicates the plurality of upper surface nozzles 34 located at the high standby positions corresponding to first return positions by solid lines, and the plurality of upper surface nozzles 34 located at second return positions by alternate long and two short dashes lines. While the second drying nozzle 61 is discharging nitrogen gas, the nozzle moving unit 43 horizontally reciprocates the plurality of upper surface nozzles 34 around the nozzle rotating axis A2, between the first return positions and the second return positions. This causes the nitrogen gas discharged from the second drying nozzle 61 to be supplied to the horizontal portions 36 and the corner portions 37 of all of the upper surface nozzles 34, and causes the liquid such as pure water to be removed from the horizontal portions 36 and corner portions 37.

Thus, the nitrogen gas that has been discharged from the second drying nozzle 61 is blown onto the plurality of upper surface nozzles 34, and the liquid such as pure water is removed from the plurality of upper surface nozzles 34. Also, when a prescribed time period has elapsed after opening of the second gas valve 65, the nozzle moving unit 43 halts rotation of the plurality of upper surface nozzles 34, disposing the plurality of upper surface nozzles 34 at the high standby positions. The second gas valve 65 is then closed, and discharge of nitrogen gas from the second drying nozzle 61 is interrupted. This completes the horizontal portion drying step.

Thus, according to the first preferred embodiment, when the spin chuck 4 is not holding the substrate W, cleaning liquid is discharged upward through the lower surface nozzle 21 while the first upper surface nozzle 34A is reciprocated horizontally between the first position and the second position. At the first middle position between the first position and the second position, the cleaning liquid that has been discharged from the lower surface nozzle 21 enters into the first upper surface nozzle 34A through the upper discharge port 35 of the first upper surface nozzle 34A. The chemical liquid or its crystals inside the first upper surface nozzle 34A are discharged downward from the upper discharge port 35, together with the cleaning liquid. The interior of the first upper surface nozzle 34A is thus cleaned.

When the first upper surface nozzle 34A is moving from the first position to the first middle position, one side portion of the dropping portion 38 of the first upper surface nozzle 34A contacts with a column of the cleaning liquid extending upward from the lower surface nozzle 21, and the cleaning liquid is supplied to the one side portion of the dropping portion 38. Similarly, when the first upper surface nozzle 34A is moving from the second position to the first middle position, the other side portion of the dropping portion 38 of the first upper surface nozzle 34A contacts with the column of the cleaning liquid extending upward from the lower surface nozzle 21, and the cleaning liquid is supplied to the other side portion of the dropping portion 38. Furthermore, the cleaning liquid supplied to the dropping portion 38 flows downward along the dropping portion 38 while flowing in the opposite direction from the movement direction of the first upper surface nozzle 34A along the dropping portion 38. This causes the cleaning liquid to also be supplied to the portion of the dropping portion 38 that did not contact the liquid column.

Thus, since the cleaning liquid is reliably supplied not only to the interior of the first upper surface nozzle 34A but also to the outer peripheral surface of the dropping portion 38, both the interior and the outer peripheral surface of the first upper surface nozzle 34A can be reliably cleaned. This can reduce the amount of residue of chemical liquid or its crystals adhering to the first upper surface nozzle 34A, and can minimize or prevent contamination of the substrate W. In addition, since the lower surface nozzle 21 that discharges liquid toward the lower surface of the substrate W is used as a first cleaning nozzle that cleans the first upper surface nozzle 34A, it is possible to avoid increasing the number of parts.

For the first preferred embodiment, a high liquid column is formed, such that the upper end of the liquid column is located higher than the lower edge of the horizontal portion 36 of the first upper surface nozzle 34A. If the liquid column is high, this will increase the area at the portion of the dropping portion 38 where the cleaning liquid is directly supplied, when the dropping portion 38 has contacted the liquid column. At the same time, the area of the portion of the dropping portion 38 where the cleaning liquid is indirectly supplied, i.e. the portion where the cleaning liquid flowing along the dropping portion 38 passes, also increases. This allows a wider region of the dropping portion 38 to be cleaned.

The corner portion 37 of the first upper surface nozzle 34A is the portion extending from the tip of the horizontal portion 36 to the upper end of the dropping portion 38, the inside portion of the corner portion 37 being hidden when the first upper surface nozzle 34A is viewed from above. A portion of the inside portion of the corner portion 37 is positioned lower than the lower edge of the horizontal portion 36, and positioned lower than the upper end of the liquid column. The cleaning liquid that has been discharged from the lower surface nozzle 21 is directly or indirectly supplied to at least a portion of the corner portion 37 while the first upper surface nozzle 34A is reciprocating. This allows the cleaning liquid to be supplied even to the inside portion of the corner portion 37 where it is difficult to supply the cleaning liquid from above, and allows the chemical liquid or its crystals to be removed from that part.

According to the first preferred embodiment, when the lower surface nozzle 21 discharges cleaning liquid upward, the nozzle moving unit 43 moves the second upper surface nozzle 34B and the third upper surface nozzle 34C together with the first upper surface nozzle 34A. During this time, the second upper surface nozzle 34B and the third upper surface nozzle 34C reciprocate between the second positions and the third positions. As a result, the second upper surface nozzle 34B and the dropping portion 38 of the third upper surface nozzle 34C are also cleaned, in addition to the dropping portion 38 of the first upper surface nozzle 34A. Consequently, all of the upper surface nozzles 34 can be cleaned without using a separate nozzle moving unit and first cleaning nozzle.

According to the first preferred embodiment, the number of reciprocations is varied depending on the type of liquid discharged toward the substrate W. When the number of reciprocations between the first position and the second position is greater than the number of reciprocations between the second positions and the third positions, the dropping portion 38 of the first upper surface nozzle 34A can be more thoroughly cleaned. In addition, when the dropping portion 38 of the second upper surface nozzle 34B is more likely to be fouled than the dropping portion 38 of the first upper surface nozzle 34A, the dropping portions 38 of the second upper surface nozzle 34B and the third upper surface nozzle 34C can be thoroughly cleaned even with a low number of reciprocations between the second position and the third position. This will allow the cleaning time to be shortened while effectively cleaning all of the upper surface nozzles 34.

According to the first preferred embodiment, the cleaning liquid is discharged from the second cleaning nozzle 51 toward the horizontal portion 36 of the first upper surface nozzle 34A that is located at the standby position. As a result, the cleaning liquid is supplied to the horizontal portion 36 and the horizontal portion 36 is cleaned. It is therefore possible to further reduce the amount of residue of the chemical liquid or its crystals adhering to the first upper surface nozzle 34A. Moreover, since the horizontal portion 36 is cleaned while the first upper surface nozzle 34A is located at a standby position, the cleaning liquid containing the chemical liquid or its crystals is less likely to fall down onto the spin chuck 4. It is thus possible to clean the horizontal portion 36 of the first upper surface nozzle 34A while preventing fouling of the spin chuck 4.

According to the first preferred embodiment, the first upper surface nozzle 34A is moved in the vertical direction while discharging the cleaning liquid obliquely through the second cleaning nozzle 51. At least a portion of the cleaning liquid that has been discharged from the second cleaning nozzle 51 directly impacts the horizontal portion 36. When the first upper surface nozzle 34A moves vertically, the position where the cleaning liquid directly impacts the first upper surface nozzle 34A changes. It is thus possible to widen the area of the portion where the cleaning liquid directly impacts. This allows the horizontal portion 36 to be effectively cleaned.

According to the first preferred embodiment, the dropping portion cleaning step is carried out with the upper surface nozzle 34 in proximity to the lower surface nozzle 21. Specifically, as shown in FIG. 9, the distance in the vertical direction from the lower discharge port 22 of the lower surface nozzle 21 to the upper discharge port 35 of the upper surface nozzle 34 is shorter than the distance in the vertical direction from the upper end of the upper surface nozzle 34 to the lower surface of the baffle plate 13. The distance in the vertical direction from the upper end of the upper surface nozzle 34 to the lower surface of the baffle plate 13 is shorter than the distance in the vertical direction from the upper discharge port 35 to the upper end of the upper surface nozzle 34. Since the upper surface nozzle 34 is thus in proximity to the lower surface nozzle 21, it is possible to contact a vigorous liquid stream with the upper surface nozzle 34, and effectively clean the dropping portion 38 of the upper surface nozzle 34.

Other Preferred Embodiments

The present invention is not restricted to the contents of the above described preferred embodiments and various modifications are possible.

Figure 16:
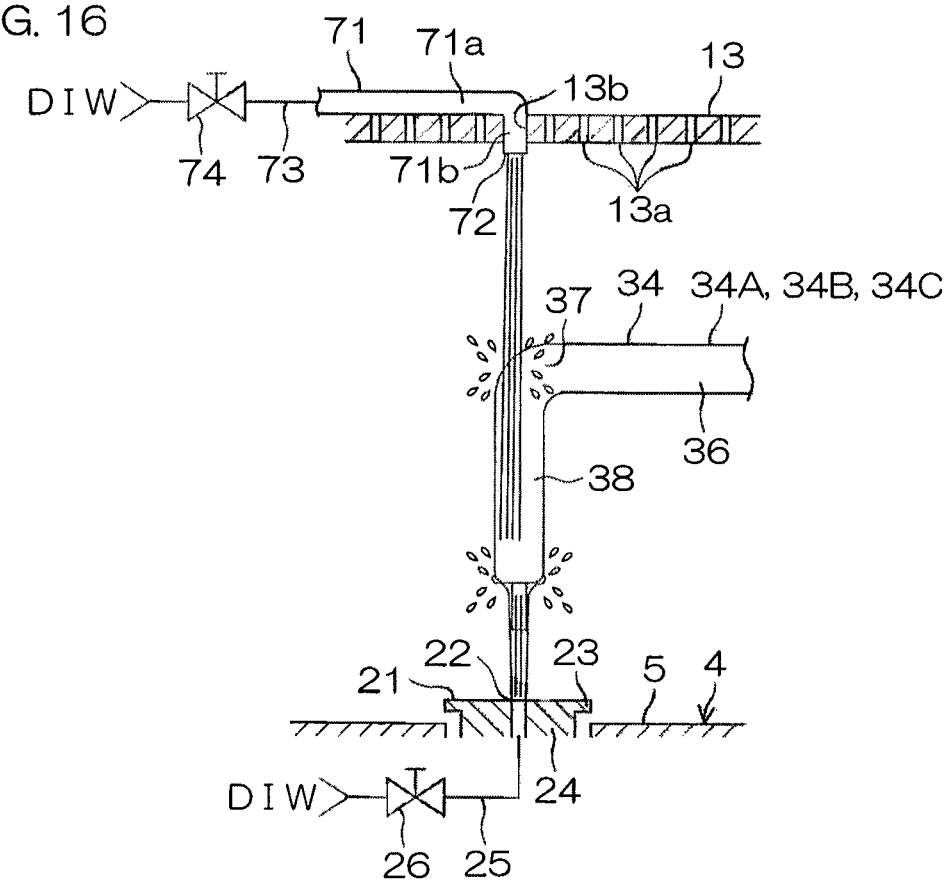
FIG. 16 is a schematic partial horizontal cross-sectional view of the third cleaning nozzle according to a second preferred embodiment of the invention.

As shown in FIG. 16, for example, in the dropping portion cleaning step described above, in addition to the pure water that has been discharged from the lower surface nozzle 21, the pure water that has been discharged from the third cleaning nozzle 71 located higher than the plurality of upper surface nozzles 34 may also be supplied to the corner portions 37 and dropping portions 38 of the plurality of upper surface nozzles 34.

The third cleaning nozzle 71 includes an upper portion 71a located above the upper surface of the baffle plate 13, a tip portion 71b extending downward from the upper portion 71a, and a third cleaning liquid discharge port 72 provided at the tip portion 71b. The tip portion 71b is inserted in an insertion hole 13b of the baffle plate 13 penetrating through the baffle plate 13 in the vertical direction. The third cleaning liquid discharge port 72 is located lower than the baffle plate 13. The third cleaning liquid discharge port 72 is disposed at a position overlapping with the upper surface of the lower surface nozzle 21, in a plan view.

The third cleaning nozzle 71 is connected to a third cleaning liquid tube 73 in which a third cleaning liquid valve 74 is interposed. When the third cleaning liquid valve 74 is opened, the pure water serving as the cleaning liquid is discharged downward from the third cleaning liquid discharge port 72 of the third cleaning nozzle 71. This causes a column of the pure water to be formed extending downward from the third cleaning nozzle 71 toward the lower surface nozzle 21.

When the plurality of upper surface nozzles 34 are moved between the first positions and the second positions while the third cleaning nozzle 71 is discharging the pure water, the dropping portion 38 of the first upper surface nozzle 34A passes horizontally through the liquid column extending downward from the third cleaning nozzle 71. Similarly, when the plurality of upper surface nozzles 34 are moved between the second positions and the third positions while the third cleaning nozzle 71 is discharging the pure water, the dropping portions 38 of the second upper surface nozzle 34B and the third upper surface nozzle 34C pass horizontally through the liquid column extending downward from the third cleaning nozzle 71.

At the first middle position between the first position and second position, the pure water that has been discharged from the third cleaning nozzle 71 impacts the outer portion of the corner portion 37 of the first upper surface nozzle 34A, and then flows downward along the outer portion of the corner portion 37 and dropping portion 38 of the first upper surface nozzle 34A. Similarly, at the second middle position between the second position and third position, the pure water that has been discharged from the third cleaning nozzle 71 flows downward along the outer portion of the corner portion 37 and dropping portion 38 of the second upper surface nozzle 34B. At the third middle position between the second middle position and third position, the pure water that has been discharged from the third cleaning nozzle 71 flows downward along the outer portion of the corner portion 37 and dropping portion 38 of the third upper surface nozzle 34C.

Thus, in the dropping portion cleaning step described above, when the pure water is discharged into the third cleaning nozzle 71, the pure water that has been discharged from the third cleaning nozzle 71 is supplied to the corner portions 37 and dropping portions 38 of all of the upper surface nozzles 34. This can further reduce the amount of residue of chemical liquid or its crystals adhering to the outer peripheral surfaces of the plurality of upper surface nozzles 34.

Figure 17:
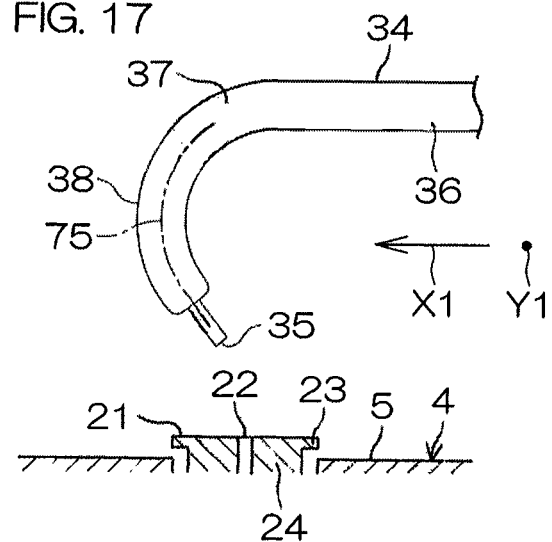
FIG. 17 is a schematic view of the first upper surface nozzle according to a third preferred embodiment of the invention.

As shown in FIG. 17, the center line of the dropping portion 38 of the upper surface nozzle 34 may have an inclined portion 75 that is obliquely inclined with respect to the horizontal plane. FIG. 17 shows an example in which, when the upper surface nozzle 34 is viewed in the array direction Y1, the dropping portion 38 of the upper surface nozzle 34 has a convex arc shape oriented in the extending direction X1 of the upper surface nozzle 34, i.e. the direction from the base of the horizontal portion 36 toward the tip of the horizontal portion 36.

Pure water that has been discharged upward from the lower surface nozzle 21 is directly supplied to the dropping portion 38. In addition, some of the pure water discharged upward from the lower surface nozzle 21 flows downward along the curved dropping portion 38. When the center line of the dropping portion 38 has an inclined portion 75, the area of the portion where the pure water discharged from the lower surface nozzle 21 directly impacts the dropping portion 38 will be greater than when the center line of the dropping portion 38 is vertical at any of the positions. This allows the dropping portion 38 to be efficiently cleaned.

Figure 18A:
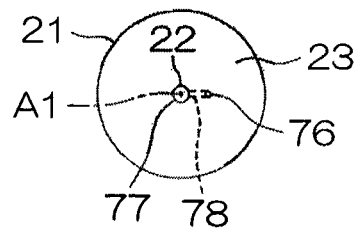
FIG. 18A is a schematic plan view of a lower surface nozzle.
Figure 18B:
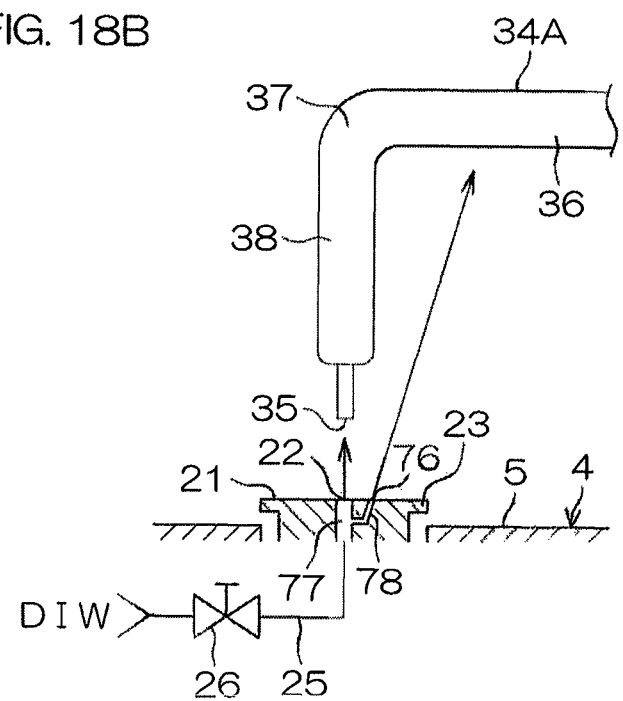
FIG. 18B shows a vertical cross-section of the lower surface nozzle.

As shown in FIG. 18A to FIG. 18B, the lower surface nozzle 21 may include a secondary discharge port 76 that discharges liquid upward, in addition to the lower discharge port 22.

The secondary discharge port 76 opens at the upper surface of the lower surface nozzle 21. FIG. 18A and FIG. 18B show examples where the open area of the secondary discharge port 76 is smaller than the open area of the lower discharge port 22, and the secondary discharge port 76 discharges pure water obliquely upward toward the lower portion of the horizontal portion 36 of the first upper surface nozzle 34A located at the first middle position. The open area of the secondary discharge port 76 may be equal to the open area of the lower discharge port 22, or it may be larger than the open area of the lower discharge port 22. The secondary discharge port 76 may also discharge pure water vertically upward.

The secondary discharge port 76 is connected to a main flow passage 77 via a branched flow passage 78 branching from the main flow passage 77 that extends along the rotational axis A. The secondary discharge port 76 upwardly discharges the liquid that has been supplied from the main flow passage 77 via the branched flow passage 78. When the second rinse liquid valve 26 is opened, both the lower discharge port 22 and the secondary discharge port 76 discharge pure water upward. This causes formation of a liquid column extending upward from the lower discharge port 22, and a liquid column extending upward from the secondary discharge port 76. The dropping portion cleaning step is carried out with both the lower discharge port 22 and the secondary discharge port 76 discharging pure water. Therefore, pure water is directly supplied not only to the dropping portion 38 but also to the lower portion of the horizontal portion 36. This allows parts other than the dropping portions 38 of the plurality of upper surface nozzles 34 to be cleaned.

Figure 19A:
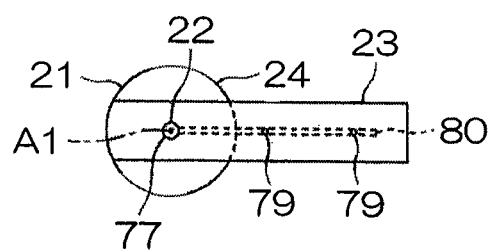
FIG. 19A is a schematic plan view of the lower surface nozzle.
Figure 19B:
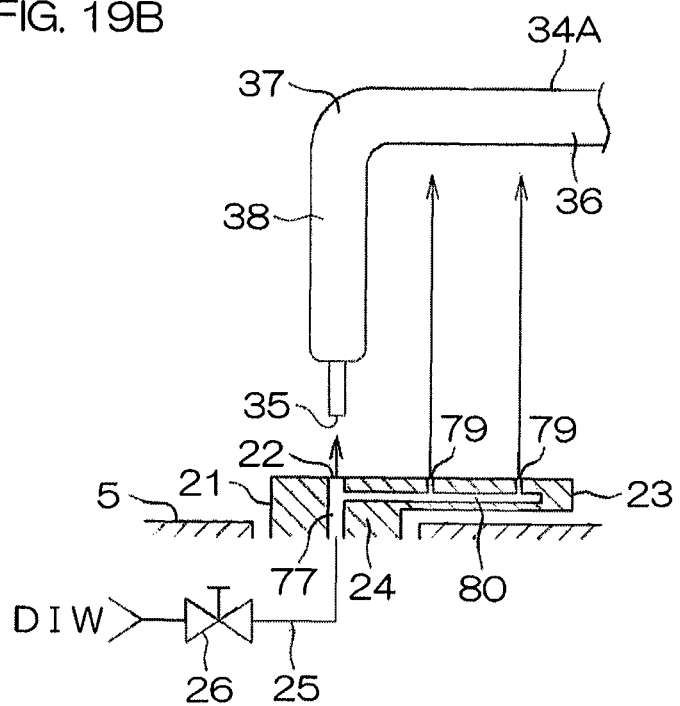
FIG. 19B shows a vertical cross-section of the lower surface nozzle.

As shown in FIG. 19A and FIG. 19B, the lower surface nozzle 21 may include a plurality of secondary discharge ports 79 that discharge liquid upward, in addition to the lower discharge port 22.

The nozzle portion 23 of the lower surface nozzle 21 is disposed at a height between the upper surface of the spin base 5 and the substrate holding position. The nozzle portion 23 is in a belt shape extending in the radial direction of the substrate W, in a plan view. The nozzle portion 23 protrudes from the base portion 24 of the lower surface nozzle 21 to only one side of the base portion 24. The lower discharge port 22 and the plurality of secondary discharge ports 79 open at the upper surface of the nozzle portion 23 that is parallel to the lower surface of the substrate W. The lower discharge port 22 is disposed on the rotational axis A1, and the plurality of secondary discharge ports 79 are disposed at a plurality of positions at different distances from the rotational axis A1 in the horizontal direction. The lower discharge port 22 and the plurality of secondary discharge ports 79 are disposed in a straight line extending in the radial direction of the substrate W.

FIG. 19A and FIG. 19B show examples where the open area of the secondary discharge port 79 is smaller than the open area of the lower discharge port 22, and the secondary discharge port 79 discharges pure water vertically upward toward the lower portion of the horizontal portion 36 of the first upper surface nozzle 34A located at the first middle position. The open area of the secondary discharge port 79 may be equal to the open area of the lower discharge port 22, or it may be larger than the open area of the lower discharge port 22. The secondary discharge port 79 may also discharge pure water obliquely upward.

The plurality of secondary discharge ports 79 is connected to the main flow passage 77 via a branched flow passage 80 branching from the main flow passage 77. The branched flow passage 80 extends horizontally along the nozzle portion 23. When the second rinse liquid valve 26 is opened, not only the lower discharge port 22 but all of the secondary discharge ports 79 discharge pure water upward. This causes formation of a liquid column extending upward from the lower discharge port 22, and a liquid column extending upward from the plurality of secondary discharge ports 79. The dropping portion cleaning step is carried out with the lower discharge port 22 and the secondary discharge port 79 discharging pure water. Therefore, pure water is directly supplied not only to the dropping portion 38 but also to the lower portion of the horizontal portion 36.

The cleaning liquid that cleans the plurality of upper surface nozzles 34 may also be a liquid other than pure water. For example, the cleaning liquid may be IPA (isopropyl alcohol), electrolytic ion water, hydrogen water, ozone water or hydrochloric acid water at dilute concentration (for example, about 10 to 100 ppm). When the chemical liquid crystals are water-soluble, the cleaning liquid is preferably a water-containing liquid that is composed mainly of water (a liquid with a water content of 80% or greater, for example). Pure water and carbonated water are examples of water-containing liquids. When the chemical liquid crystals are water-repellent, the cleaning liquid is preferably a liquid that is an organic solvent such as IPA.

The drying gas used to dry the upper surface nozzle 34 may be an inert gas other than nitrogen gas, or it may be a gas other than an inert gas.

As long as the pure water that has been discharged upward from the lower surface nozzle 21 is supplied to the dropping portion 38 of the upper surface nozzle 34, the upper end of the liquid column formed in the dropping portion cleaning step may be located lower than the lower edge of the horizontal portion 36, as viewed from the side.

The plurality of upper surface nozzles 34 may differ from the other upper surface nozzles 34 in either or both their shape and structure.

The number of upper surface nozzles 34 is not limited to three, and may instead be one, two, or four or more.

By horizontally reciprocating the plurality of upper surface nozzles 34 between the first positions and the second positions, the dropping portions 38 of two or more upper surface nozzles 34 can be cleaned. The third positions, for example, may also be the second positions. In this case, since the dropping portions 38 of all of the upper surface nozzles 34 can be cleaned by horizontally reciprocating the plurality of upper surface nozzles 34 between the first positions and the second positions, it is not necessary to horizontally reciprocate the plurality of upper surface nozzles 34 between the second positions and third positions.

The same type of processing liquid may be supplied to all of the upper surface nozzles 34. In this case, when the processing liquid is supplied to the substrate W, the processing liquid may be discharged through all of the upper surface nozzles 34.

The horizontal portion cleaning step may be followed by a dropping portion cleaning step. Likewise, the horizontal portion drying step may be followed by a dropping portion drying step.

For the horizontal portion cleaning step, the plurality of upper surface nozzles 34 may be moved horizontally while discharging the pure water through the second cleaning nozzle 51. For example, the plurality of upper surface nozzles 34 may be reciprocated horizontally. In this case, the plurality of upper surface nozzles 34 horizontally pass in order, through a sheet-like liquid stream flowing obliquely downward from the second cleaning nozzle 51. This causes the pure water discharged from the second cleaning nozzle 51 to be supplied to the plurality of upper surface nozzles 34.

In FIG. 18A and FIG. 18B, the secondary discharge port 76 does not need to be connected to the main flow passage 77 via the branched flow passage 78. Similarly, in FIG. 19A and FIG. 19B, the secondary discharge port 79 does not need to be connected to the main flow passage 77 via the branched flow passage 80. In other words, a flow channel that is independent from the main flow passage, i.e. that does not cross with the main flow passage, may be provided in the lower surface nozzle 21, and that flow channel may be connected to at least one secondary discharge port.

The spin chuck 4 is not limited to a clamping type chuck in which the plurality of chuck pins 6 are brought into contact with the outer peripheral surface of the substrate W, and may be a vacuum type chuck in which the rear surface (lower surface) of the substrate W that is a non-device forming surface is suctioned onto the upper surface of the spin base 5 to hold the substrate horizontally, or a chuck of a type other than these.

The substrate processing apparatus 1 is not limited to an apparatus that processes a disk-shaped substrate W and may be an apparatus that processes a polygonal substrate W.

Two or more of any of the arrangements described above may be combined. Two or more of any of the steps described above may be combined.

The present application corresponds to Japanese Patent Application No. 2016-166951 filed in the Japan Patent Office on Aug. 29, 2016 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A nozzle cleaning method which cleans an upper surface nozzle that discharges liquid downward from an upper discharge port toward an upper surface of a substrate held by a substrate holding unit that rotates the substrate disposed at a substrate holding position while holding the substrate horizontally, the upper surface nozzle including a horizontal portion extending horizontally, a corner portion bent downward from a tip of the horizontal portion, a dropping portion extending downward from the corner portion, and the upper discharge port opening at a lower surface of the dropping portion, the nozzle cleaning method comprising:
    a liquid column forming step of forming a liquid column that extends upward from a lower surface nozzle, that discharges liquid upward toward the substrate holding position, by causing the lower surface nozzle to discharge cleaning liquid when the substrate holding unit is not holding the substrate; and
    a first dropping portion cleaning step of causing the upper surface nozzle to pass through a first middle position where the upper discharge port of the upper surface nozzle overlaps with the liquid column in a plan view by horizontally reciprocating the upper surface nozzle between a first position where the dropping portion of the upper surface nozzle does not contact the liquid column and a second position where the dropping portion of the upper surface nozzle does not contact the liquid column in parallel with the liquid column forming step.

2. A nozzle cleaning method according to claim 1, wherein the liquid column forming step is a step of forming the liquid column such that an upper end of the liquid column is positioned higher than a lower edge of the horizontal portion of the upper surface nozzle.

3. A nozzle cleaning method according to claim 1, further comprising:
    a second dropping portion cleaning step of causing a second upper surface nozzle to pass through a second middle position where an upper discharge port of the second upper surface nozzle overlaps with the liquid column in a plan view by causing a nozzle moving unit, that moves the upper surface nozzle, to reciprocate horizontally the second upper surface nozzle between the second position where a dropping portion of the second upper surface nozzle does not contact the liquid column and a third position where the dropping portion of the second upper surface nozzle does not contact the liquid column in parallel with the liquid column forming step.

4. A nozzle cleaning method according to claim 3, wherein the second dropping portion cleaning step is a step of horizontally reciprocating the second upper surface nozzle between the second position and the third position at fewer times than a number of reciprocations of the upper surface nozzle in the first dropping portion cleaning step.

5. A nozzle cleaning method according to claim 1, further comprising:
a horizontal portion cleaning step of causing a second cleaning nozzle to discharge cleaning liquid toward the horizontal portion of the upper surface nozzle located at a standby position where the upper surface nozzle is disposed outside of the substrate holding unit in a plan view.

6. A nozzle cleaning method according to claim 5, wherein:
the second cleaning nozzle includes a second cleaning liquid discharge port that discharges the cleaning liquid in an obliquely inclined direction with respect to a horizontal plane, toward the horizontal portion of the upper surface nozzle located at the standby position, and
the horizontal portion cleaning step is a step of causing the upper surface nozzle to move in a horizontal direction or a vertical direction while causing the second cleaning liquid discharge port of the second cleaning nozzle to discharge the cleaning liquid toward the horizontal portion of the upper surface nozzle located at the standby position.

7. A nozzle cleaning method according to claim 1, wherein the first dropping portion cleaning step is a step of causing the lower surface nozzle and a third cleaning nozzle, that discharges cleaning liquid downward toward the dropping portion of the upper surface nozzle located at the first middle position, to discharge the cleaning liquid while horizontally reciprocating the upper surface nozzle between the first position and the second position.

8. A nozzle cleaning method according to claim 1, wherein:
the lower surface nozzle includes a lower discharge port that discharges liquid upward toward the upper discharge port of the upper surface nozzle located at the first middle position, and at least one secondary discharge port that discharges liquid upward toward the horizontal portion of the upper surface nozzle located at the first middle position, and
the first dropping portion cleaning step is a step of causing the lower discharge port and the at least one secondary discharge port to discharge the cleaning liquid while horizontally reciprocating the upper surface nozzle between the first position and the second position.

* * * * *